United States Patent
Aburatani

(10) Patent No.: US 8,814,488 B2
(45) Date of Patent: Aug. 26, 2014

(54) SUBSTRATE PROCESSING APPARATUS AND SEMICONDUCTOR DEVICE MANUFACTURING METHOD

(75) Inventor: Yukinori Aburatani, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 517 days.

(21) Appl. No.: 12/078,513

(22) Filed: Apr. 1, 2008

(65) Prior Publication Data

US 2008/0260502 A1  Oct. 23, 2008

(30) Foreign Application Priority Data

Apr. 2, 2007 (JP) ................................. 2007-096933
Mar. 11, 2008 (JP) ................................. 2008-060765

(51) Int. Cl.
*H01L 21/677* (2006.01)

(52) U.S. Cl.
USPC ........................................ 414/217; 414/805

(58) Field of Classification Search
USPC ......... 414/411, 410, 147, 160, 172, 217, 414, 414/458, 589, 609, 662, 668, 671, 805, 414/226.04, 783, 816, 680; 700/213, 218
See application file for complete search history.

(56) References Cited

U.S. PATENT DOCUMENTS

| | | | | |
|---|---|---|---|---|
| 6,071,059 A | * | 6/2000 | Mages et al. | 414/411 |
| 6,092,980 A | * | 7/2000 | Kumasaka et al. | 414/804 |
| 6,364,593 B1 | * | 4/2002 | Hofmeister et al. | 414/217.1 |
| 6,435,330 B1 | * | 8/2002 | Bonora et al. | 198/346.3 |
| 6,582,174 B1 | * | 6/2003 | Hayashi | 414/217 |
| 6,599,075 B2 | * | 7/2003 | Davis et al. | 414/217 |
| 6,852,601 B2 | * | 2/2005 | Yoshida et al. | 438/308 |
| 7,077,614 B1 | * | 7/2006 | Hasper et al. | 414/217 |
| 7,114,903 B2 | * | 10/2006 | Harris et al. | 414/222.01 |
| 7,409,263 B2 | * | 8/2008 | Elliott et al. | 700/218 |
| 7,887,276 B2 | * | 2/2011 | Natume | 414/217 |
| 2001/0016307 A1 | * | 8/2001 | Ishii | 432/239 |
| 2001/0038783 A1 | * | 11/2001 | Nakashima et al. | 414/217 |

(Continued)

FOREIGN PATENT DOCUMENTS

JP   10-256346   9/1998

(Continued)

OTHER PUBLICATIONS

Office Action dated Nov. 25, 2008 corresponding to the Japanese Patent Application No. 2008-060765 with English translation.
Korean Office Action dated Mar. 17, 2010 with its English translation.

*Primary Examiner* — Saul Rodriguez
*Assistant Examiner* — Glenn Myers
(74) *Attorney, Agent, or Firm* — Kratz, Quintos & Hanson, LLP

(57) ABSTRACT

A substrate processing apparatus comprises a storage container for storing multiple substrates and whose substrate loading and unloading opening is sealed by a lid, a load port for placing the storage container, an attaching and detaching device for attaching and detaching the lid on the substrate loading and unloading opening in the load port, a first placement unit for mounting the storage container in the load port and moving away from and near the attaching and detaching device, and a second placement unit provided separately from the first placement unit, for mounting the storage container in the load port and moving up and down relative to the attaching and detaching device.

19 Claims, 24 Drawing Sheets

(56) References Cited

U.S. PATENT DOCUMENTS

2002/0048509 A1* 4/2002 Sakata et al. .................. 414/800
2002/0197145 A1* 12/2002 Yamamoto et al. ........... 414/806
2004/0191046 A1* 9/2004 Mitsuyoshi ................... 414/754
2006/0045662 A1* 3/2006 Aalund et al. ................. 414/217
2006/0188358 A1* 8/2006 Bonora et al. ................. 414/217

FOREIGN PATENT DOCUMENTS

| JP | 2002-246439 | 8/2002 |
| JP | 2003-7801 | 1/2003 |
| JP | 2004-140011 | 5/2004 |
| JP | 2006-261546 | 9/2006 |
| JP | 2008-53596 | 3/2008 |

\* cited by examiner

F I G. 2
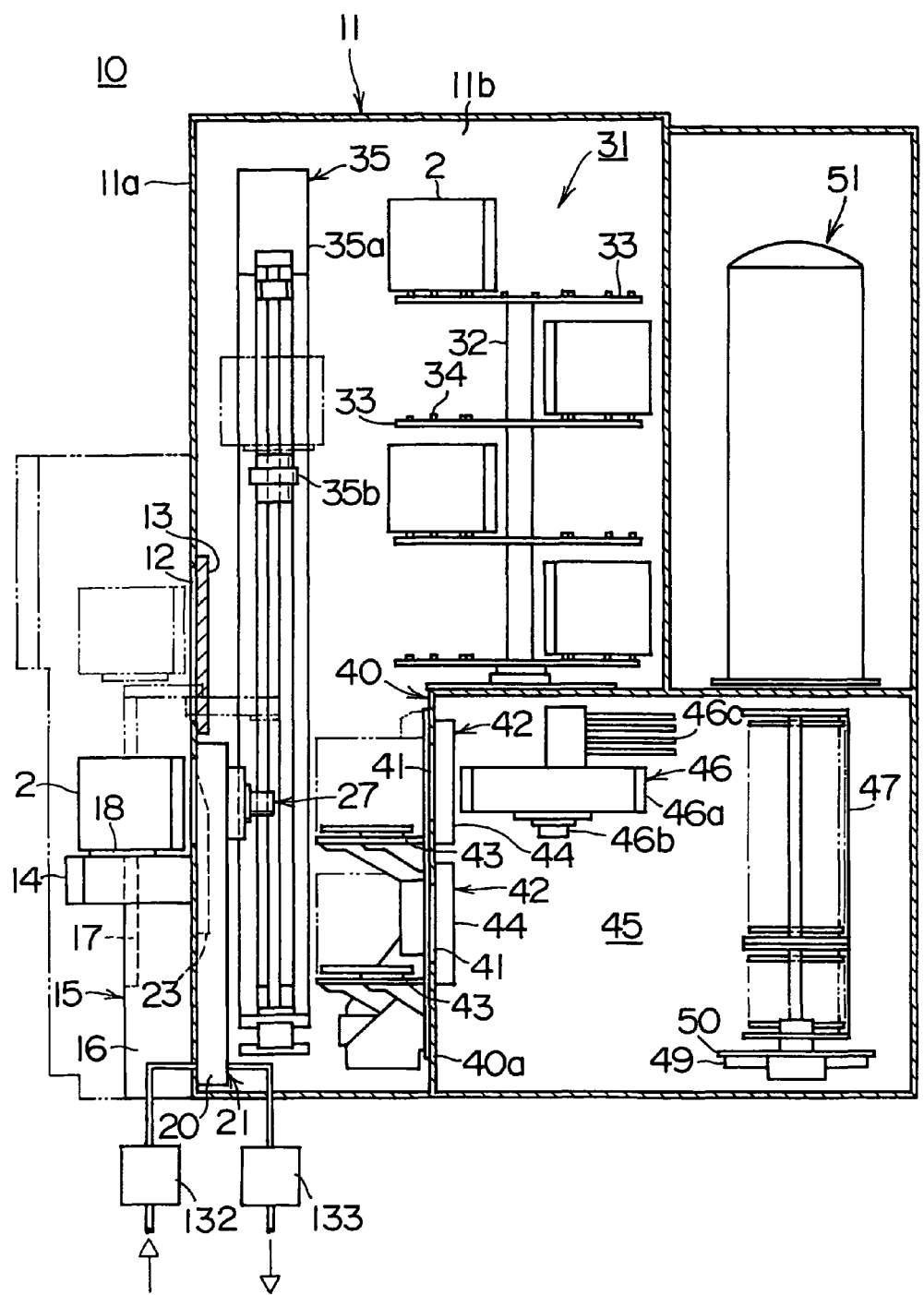

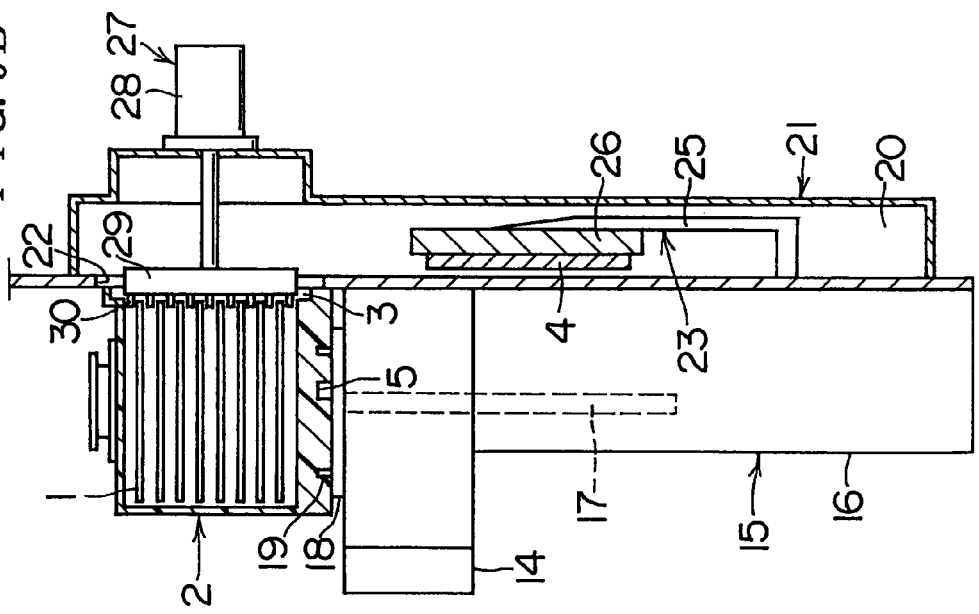
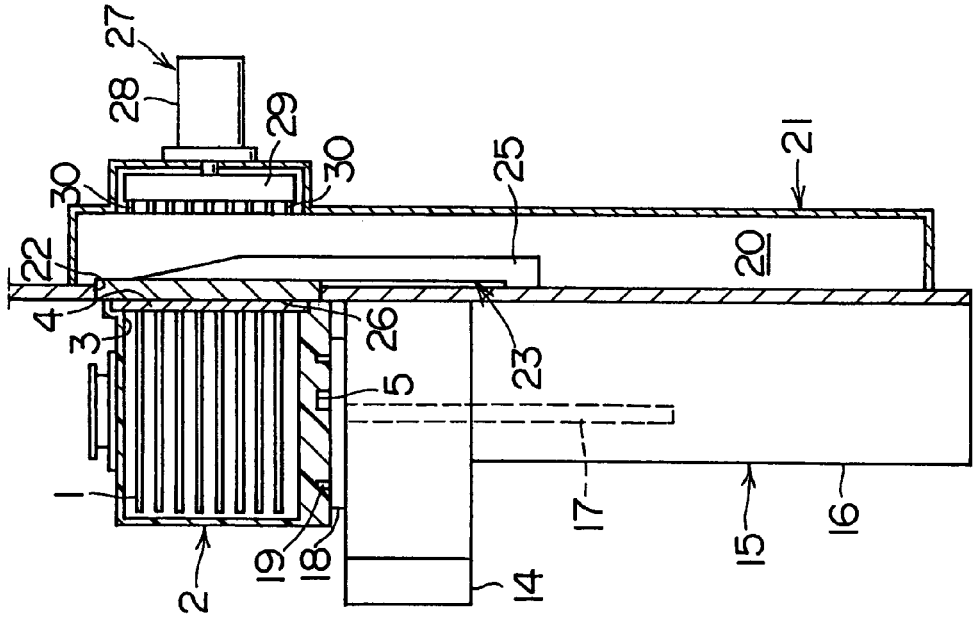

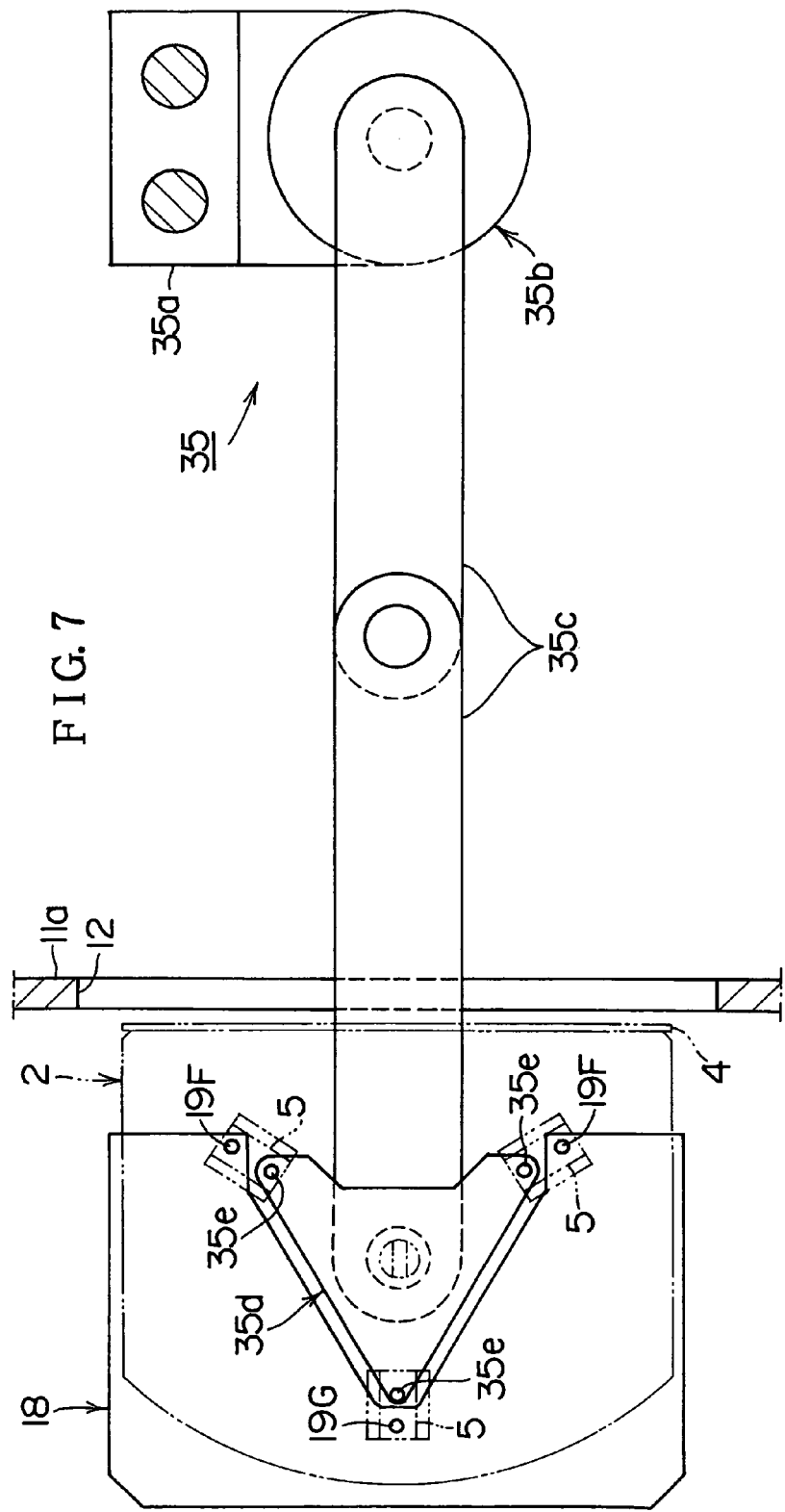

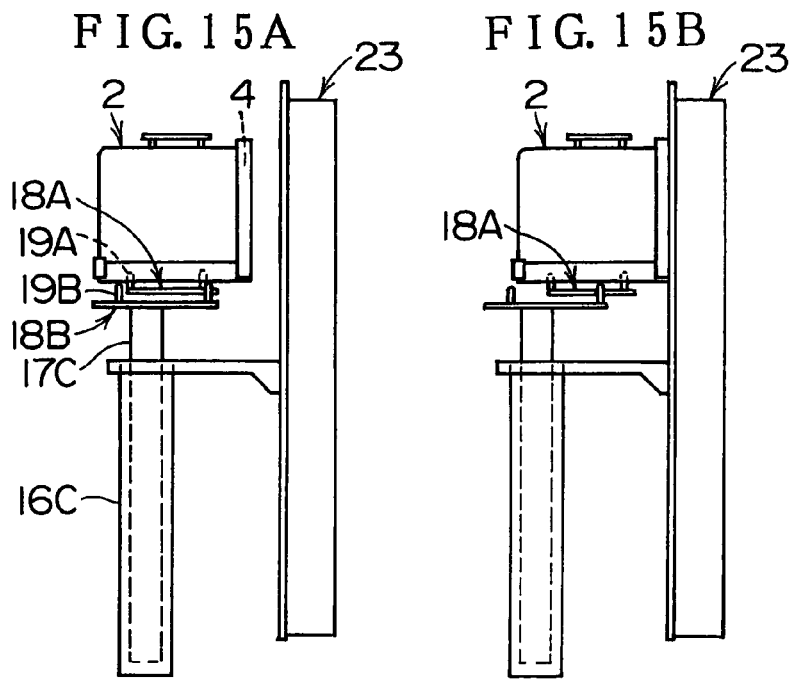
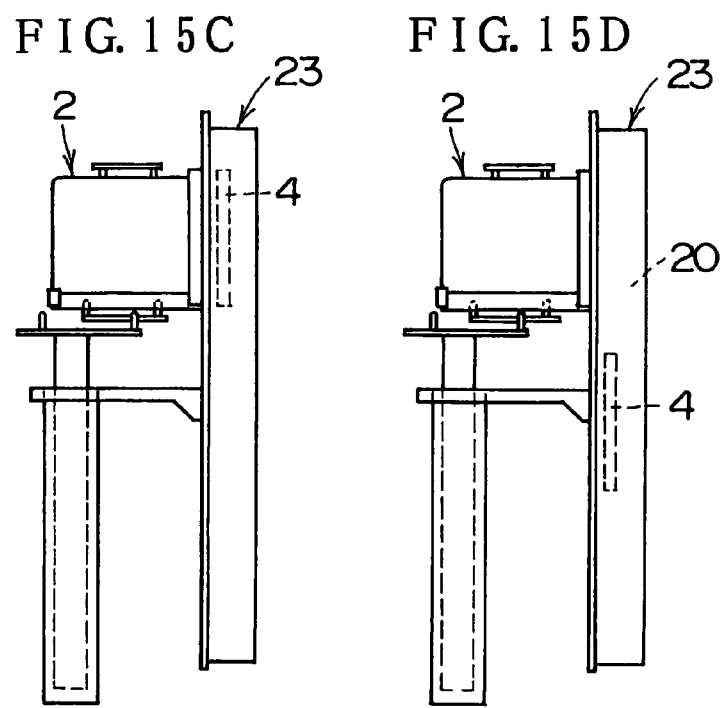

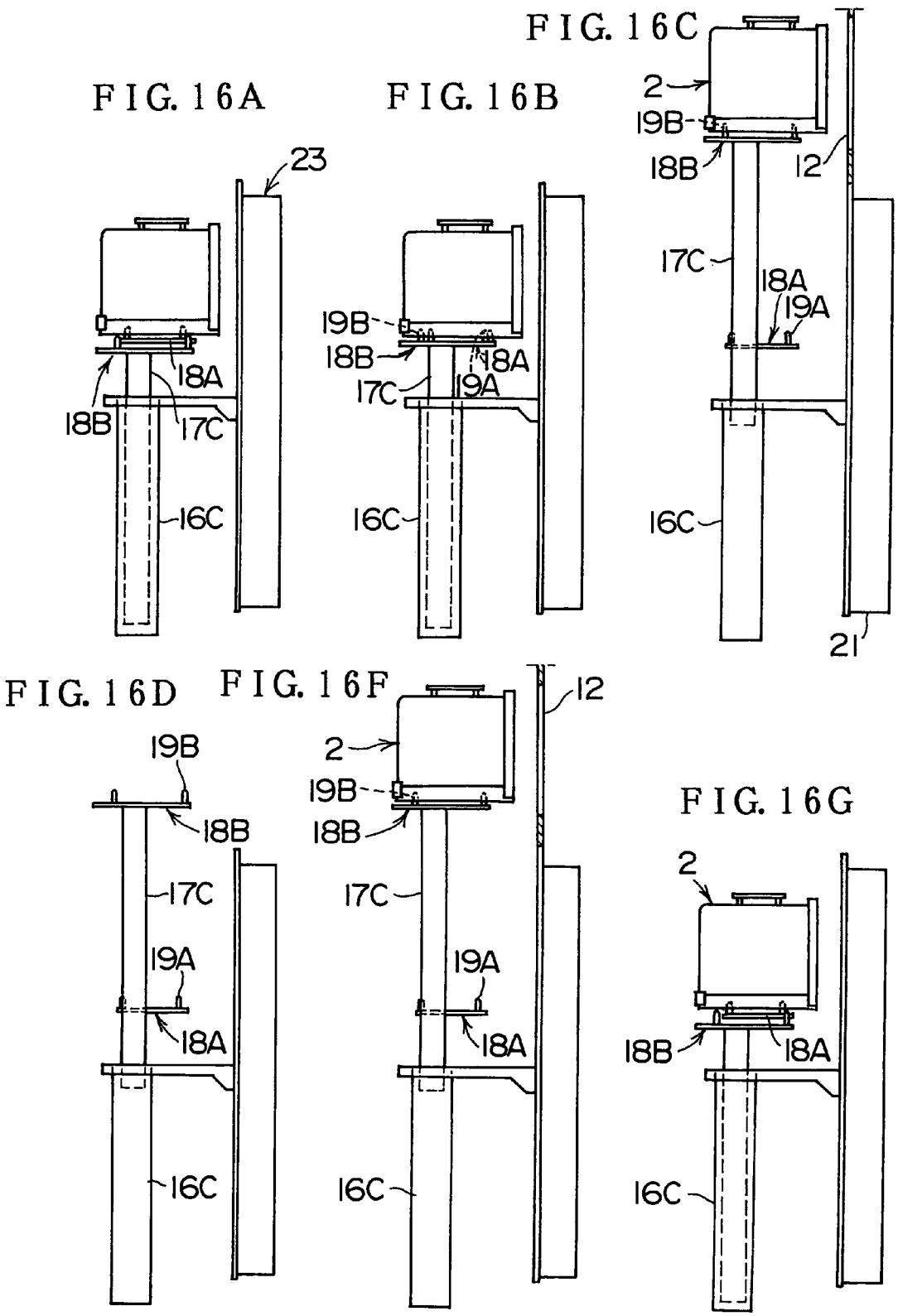

F I G. 17
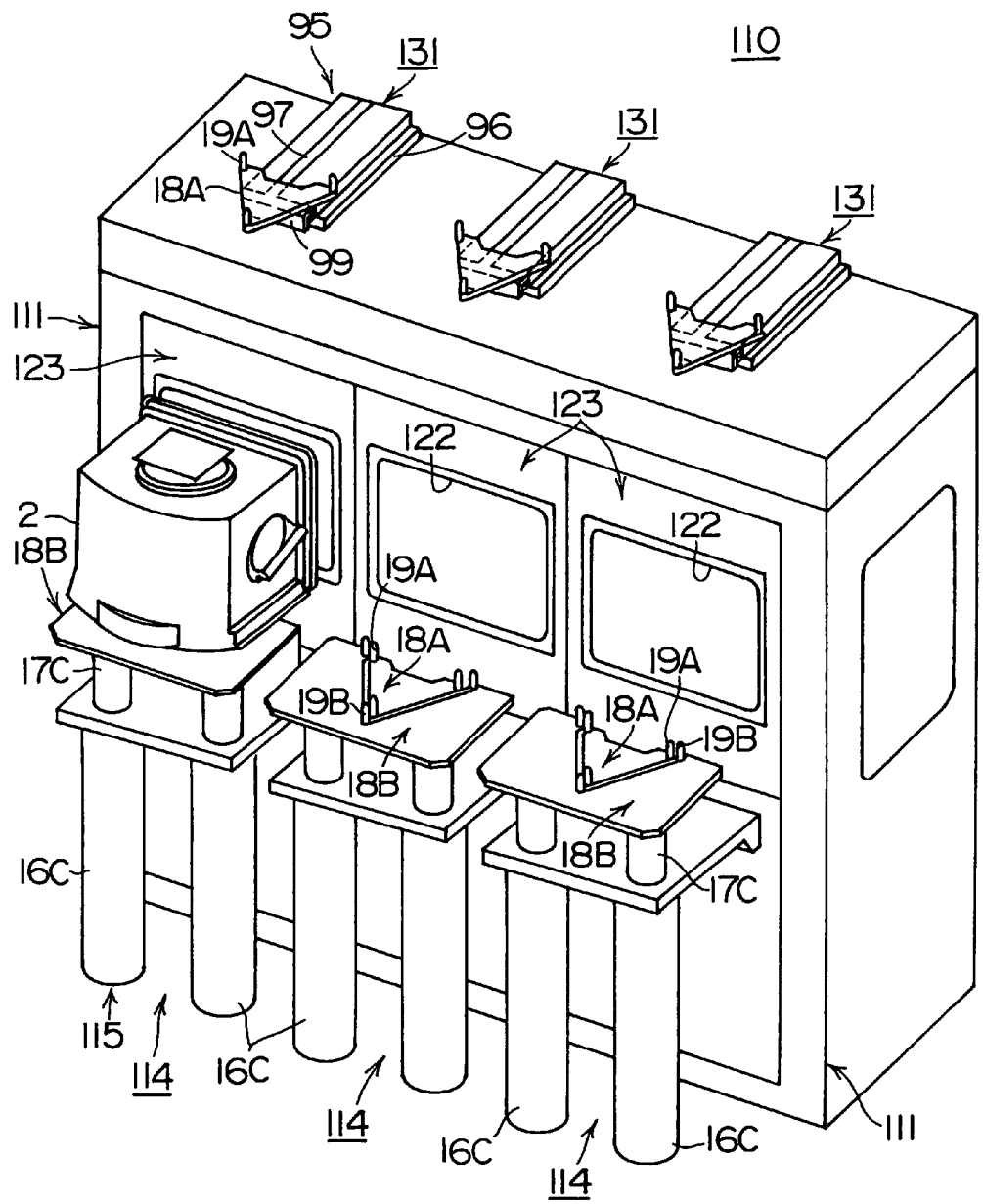

F I G. 2 0 A
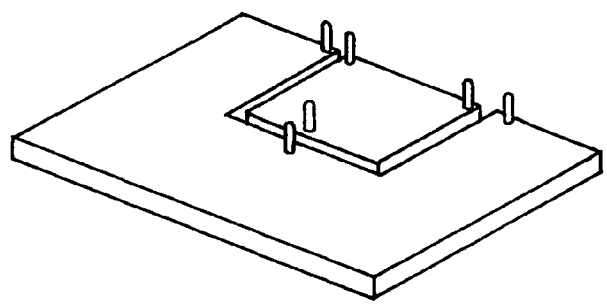
F I G. 2 0 B
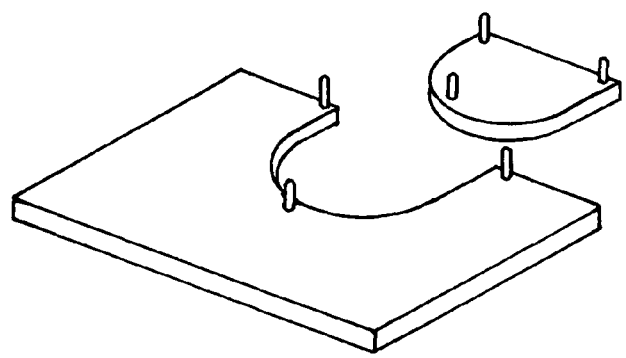
F I G. 2 0 C
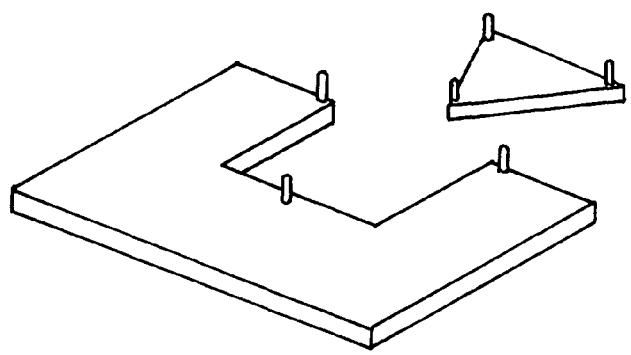

SUBSTRATE PROCESSING APPARATUS AND SEMICONDUCTOR DEVICE MANUFACTURING METHOD

BACKGROUND OF INVENTION

1. Technical Field

The present invention relates to a substrate processing apparatus and a semiconductor device manufacturing method.

The present invention for example is effectively utilized in batch type vertical diffusion CVD apparatus for forming CVD films such as metallic films and insulation films or diffusing dopants on semiconductor wafers (hereinafter called "wafers") on which semiconductor integrated circuits containing semiconductor elements are formed.

2. Description of Related Art

The batch type vertical diffusion CVD apparatus (hereinafter called "batch CVD apparatus") serving as one example of the substrate processing apparatus handles multiple wafers while stored in a storage container.

The storage container of the conventional art includes open cassettes and FOUP (front opening unified pods. hereinafter called "pods")

The open cassette is formed in a cubic parallelpiped box shape with a pair of open sides facing each other.

The pod is formed in a cubic parallelpiped box shape, along with being open on one side is fitted with a freely attachable and detachable door (lid) on the open side.

If the pod is utilized as a wafer storage container, then the wafers are transferred while in a sealed state. Therefore, wafer cleanliness can be maintained even if particles or other matter are present in the atmosphere. The purity within the clean room where the batch CVD apparatus is installed therefore need not be set to a high level so that costs required for the clean room can be reduced.

The latest CVD batch apparatus therefore utilize pods in the storage container.

A batch CVD apparatus using pods contains a pod opener and closer device (hereinafter called "a pod opener") and a mapping device in a load port where the wafers are loaded into the pod or unloaded from the pod (See for example the patent document 1).

The pod opener is a mechanism for opening and closing the wafer loading and unloading opening of the pod by attaching the door onto the wafer loading and unloading opening of the pod or removing the door from the wafer loading and unloading opening of the pod.

The mapping device is a mechanism for sensing wafers within the pod and detecting whether or not wafers are being held in the respective wafer holding grooves (slots) within the pod.

Patent document 1: Japanese Patent Non-Examined Publication No. 2003-7801

In batch CVD apparatus of the conventional art, the pod door cannot be attached or removed in the load port for carrying pods into the case of the batch CVD apparatus from the outside the device (outside the case), and carrying out pods from inside the case.

In order to attach or detach the pod door in the load port, a structure was conceived that allows the pod opener to retreat in the load port. In other words, a path is provided for carrying the pod in or carrying the pod out, by retreating the pod opener from the load port when carrying the pod from outside the case to inside the case, and when carrying the pod from inside the case to outside the case.

However, this structure possesses the problem that the batch CVD apparatus is complicated because the pod opener must be retreated from the load port.

DISCLOSURE OF INVENTION

The present invention has an object of providing a semiconductor device manufacturing method and a substrate processing apparatus with a simple structure and capable of attaching and detaching the lid of the storage container in the load port for carrying the storage container in and out from the inside or outside the case.

A typical aspect for resolving the aforementioned problems is described next.

A substrate processing apparatus comprising:

a storage container for storing multiple substrates and whose substrate loading and unloading opening is sealed by a lid, a load port for carrying the storage container in and out between the inside and the outside of the case, an attaching and detaching device for attaching and detaching the lid on the substrate loading and unloading opening in the load port, a first placement unit for mounting the storage container in the load port and moving away from and near the attaching and detaching device, and a second placement unit provided separately from the first placement unit, for mounting the storage container in the load port and moving up and down relative to the attaching and detaching device.

The above aspect along with being capable of attaching and detaching the lid on the storage container in the load port for carrying the storage container inside and outside the case, can be also a simple structure.

BRIEF DESCRIPTION OF DRAWINGS

FIG. 2 is a side cross sectional view;

FIG. 5A and FIG. 5B are partially omitted side cross sectional views for describing the action of the pod opener; FIG. 5A shows the state prior to removal of the door; FIG. 5B shows the state during mapping;

FIG. 7 is a partially omitted plan view showing that main section;

FIG. 8A is a perspective view, and FIG. 8B is a bottom view.

FIG. 14A is a drawing showing the linear actuator extended; FIG. 14B is a drawing showing the linear actuator contracted;

FIG. 15A through FIG. 15D are each concept side views for describing the operation of the inner plate;

FIGS. 16A, 16B, 16C, 16D, 16F and 16G are each concept side views for describing the operation of the outer plate;

FIG. 17 is a perspective view for showing the load port in the single wafer CVD apparatus of the fifth embodiment of the present invention;

FIG. 20A through FIG. 20C are each perspective views for showing variation of the inner plate and the outer plate;

DETAILED DESCRIPTION OF PREFERRED EMBODIMENTS

Figure 1:
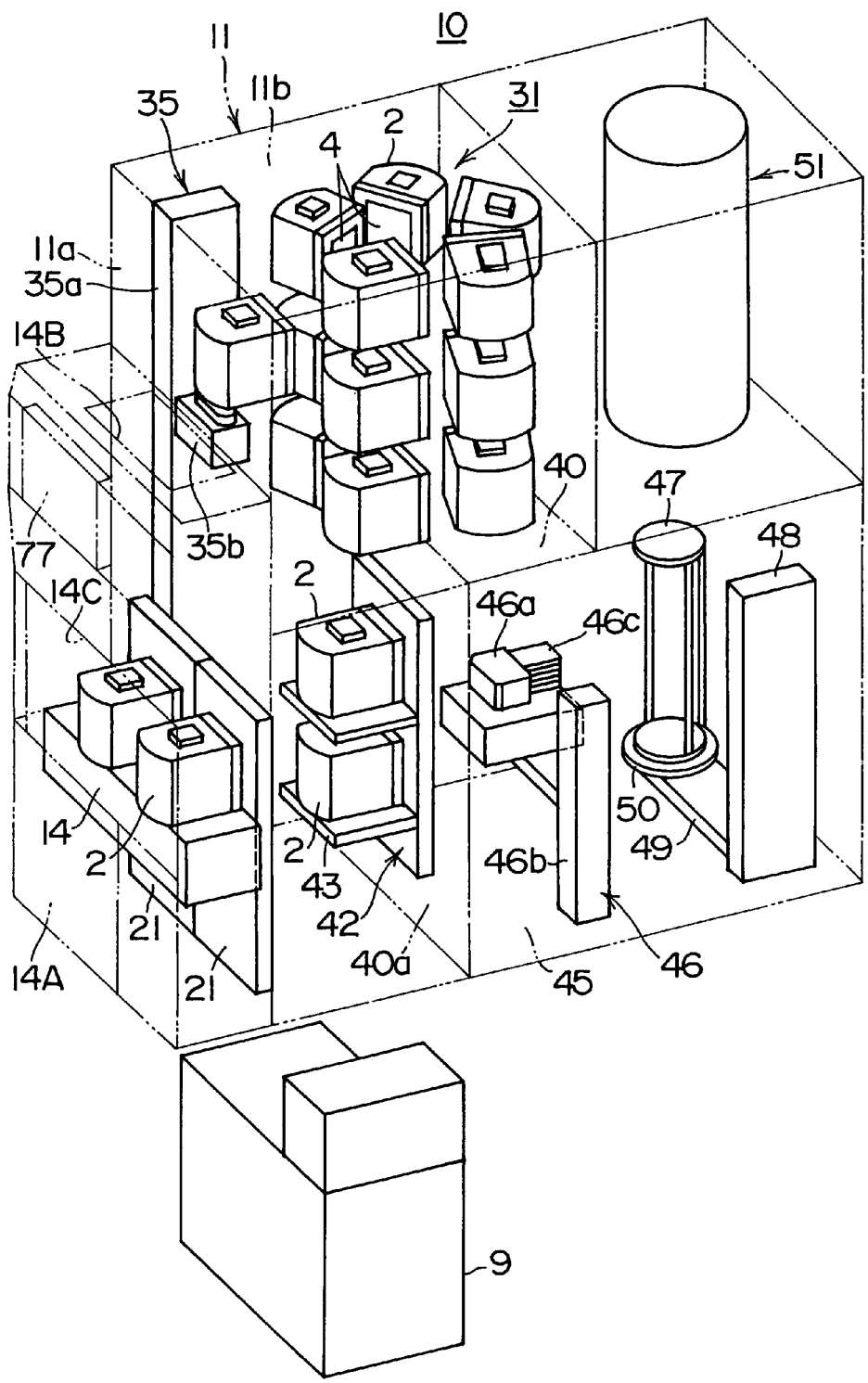
FIG. 1 is a partially omitted perspective view showing the batch CVD apparatus of the first embodiment of the present invention.

An embodiment of the present invention is described next while referring to the drawings.

In this embodiment, the substrate processing apparatus of the present invention is a batch CVD apparatus or in other words a batch vertical diffusion CVD apparatus as shown in FIG. 1 and FIG. 2.

In the following description, a controller 77 controls the operation of each unit making up the batch vertical diffusion CVD apparatus.

Also in the present embodiment, a pod 2 is utilized as a carrier (storage container) for storing wafers 1 serving as the substrate for processing.

Figure 3:
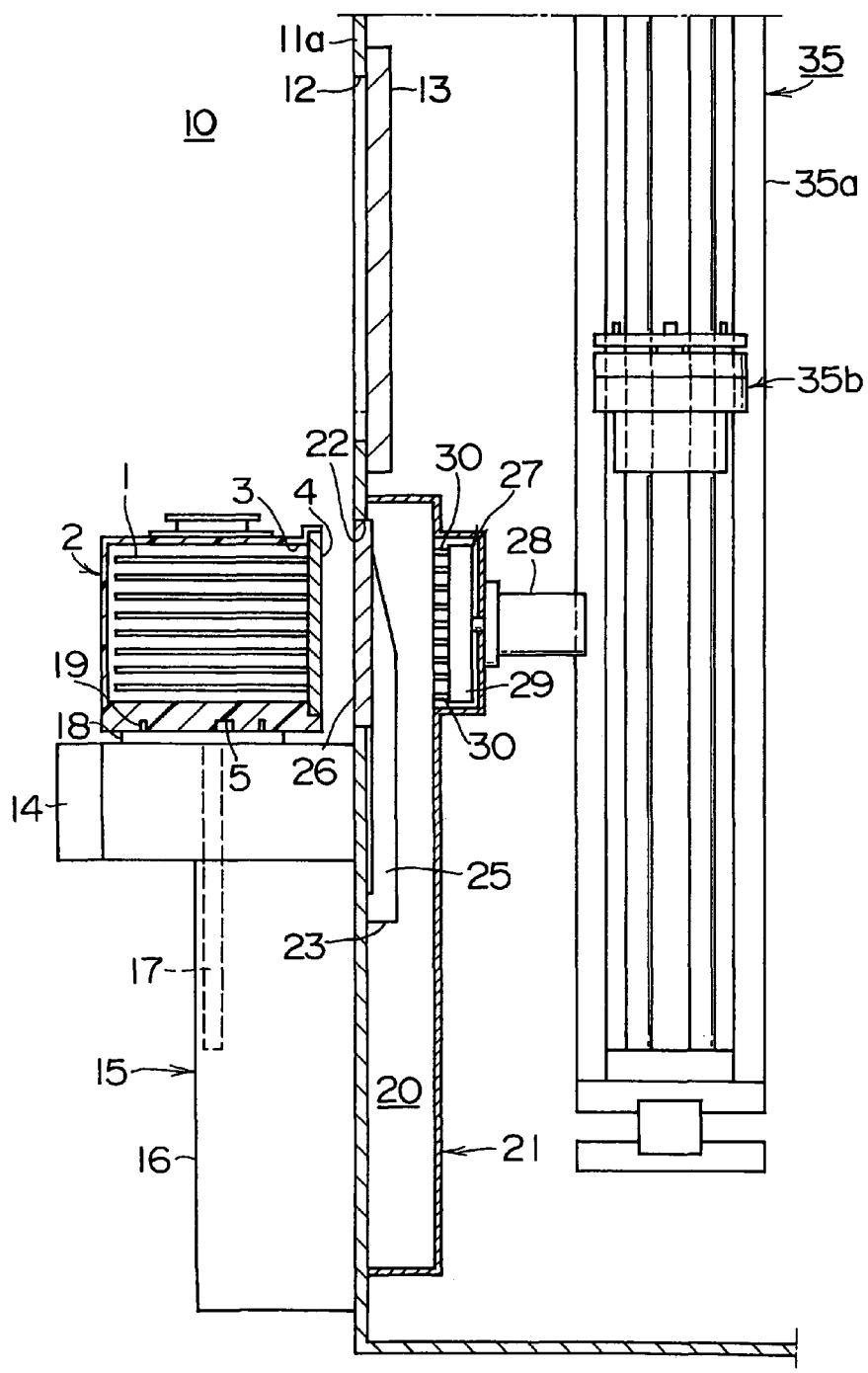
FIG. 3 is a side cross sectional view showing a main section.
Figure 8A:
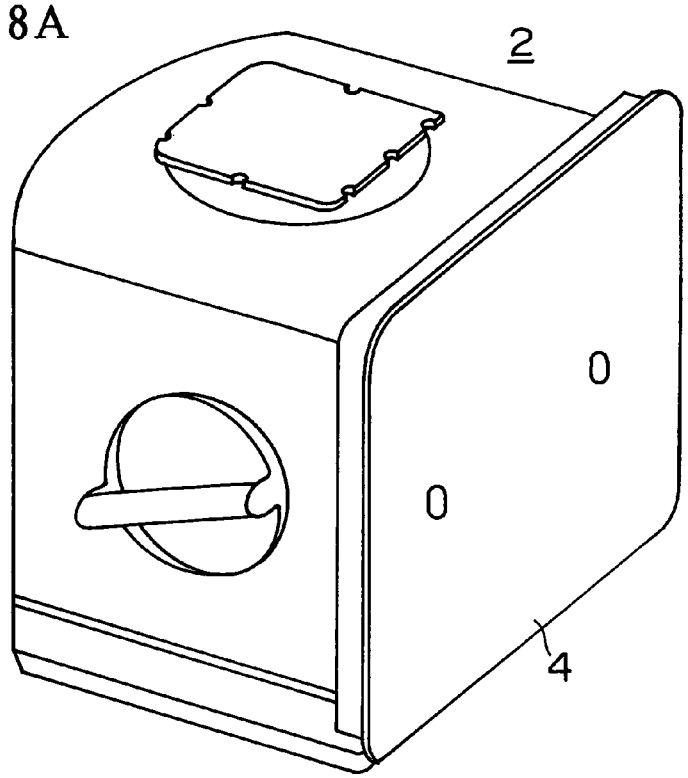
FIG. 8A and FIG. 8B are drawings showing the pod.
Figure 8B:
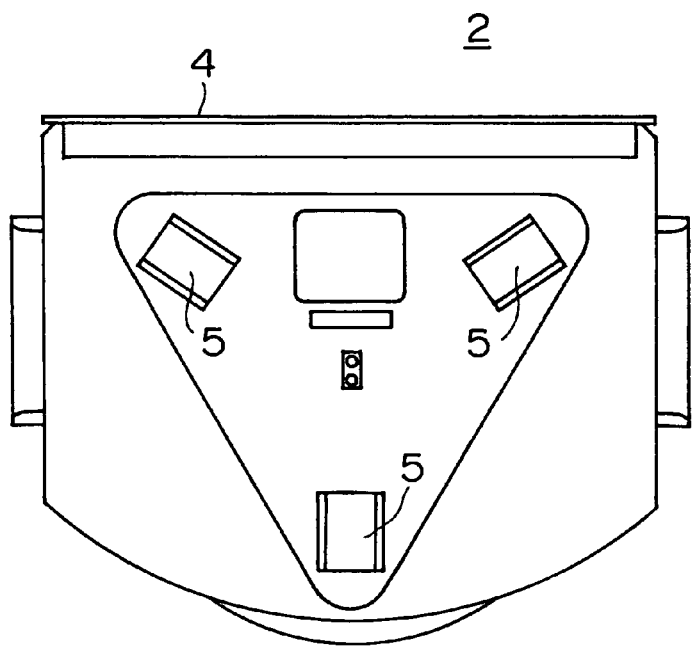

The pod 2 is formed in an approximately cubic parallelpiped box shape as shown in FIG. 3, FIG. 8A and FIG. 8B, and a wafer loading and unloading opening 3 is formed on one side wall of the cube. A door 4 capable of being attached or detached is fitted as a lid onto the wafer loading and unloading opening 3.

Three positioning holes 5, 5, 5 are formed on bottom side of the pod 2 in a rotational symmetry at a phase difference of 120 degrees to each other as shown in FIG. 8B. In other words, the first positioning hole 5 is positioned on a center line extending frontward and rearward on the bottom side of the pod 2. The second positioning hole 5 and the third positioning hole 5 are respectively positioned in a bilateral symmetry relative to the center line at the front of the first positioning hole 5.

The three positioning holes 5, 5, 5 are respectively formed in a V groove shape and have a rectangular shape as seen from a plan view. The bottom of the V groove of each of the positioning holes 5, 5, 5 is positioned facing towards the center of rotational symmetry.

These three positioning holes 5, 5, 5 are defined in SEMI E57-0600 and positioned corresponding to primary pin (pin supporting the bottom edge side of the pod) and the secondary pin (pin supporting the bottom center side of the pod) defined in SEMI E57-0600.

A batch CVD apparatus 10 of this embodiment includes a main case 11 as shown in FIG. 1, FIG. 2, and FIG. 3.

A front wall 11a of the main case 11 is a partition for partitioning the inside and outside of the main case 11. A pod loading and unloading opening (hereinafter called "pod loading opening") 12 is formed to connect the inside and outside of the main case 11 on the intermediate height of the front wall 11a. The pod loading opening 12 is an opening for carrying in the pod 2, and carrying out the pod 2. A front shutter 13 opens and closes the pod loading opening 12.

A load port 14 is provided on the outer side of the front wall (partition) 11a of the main case 11. The load port 14 is positioned almost directly below the pod loading opening 12. The load port 14 constitutes a loading and unloading port. The load port 14 aligns the placed pod 2 with the pod loading opening 12. Two load ports 14 are provided in parallel.

An in-process transfer device (also called "inter process transfer device") outside the batch CVD apparatus (outside the case), carries the pod 2 into the load port 14 and carries the pod 2 out from the load port 14.

A floor drive internal transfer cart 9 (hereinafter called "AGV") shown in FIG. 1 or a ceiling track overhead hoist transport (OHT) may be utilized as an in-process transfer device.

A box 14A serving as a front case is installed on the front side of the front wall 11a. This box 14A is formed so as to enclose the load port 14 and the upper space of the load port 14. A ceiling opening 14B is formed on the ceiling wall of the box 14A. A front opening 14C is formed on the front wall of the box 14. In other words, the load port 14 can receive the pod 2 by way of the front opening 14C or can receive the pod 2 by way of the ceiling opening 14B.

The box 14A and the main case 11 together make up the case of the batch CVD apparatus.

A controller 77 described later on is installed inside the box 14A as shown in FIG. 1.

A pod elevator 15 is installed in the load port 14. The pod elevator 15 raises and lowers the pod 2 between the pod loading opening 12 height and the load port 14 height. The pod elevator 15 in other words makes up a storage container placement unit elevator mechanism.

The pod elevator 15 contains an elevator drive unit 16, and a shaft 17 raised and lowered by the elevator drive unit 16, and a support stand (storage container placement unit) 18 mounted horizontally on the upper end of the shaft 17, and multiple receiver kinematic pins 19 affixed protruding from the upper surface of the support stand 18. These receiver kinematic pins 19 are the storage container positioning means (also called "the positioning unit"). These receiver kinematic pins 19 are equivalent to the primary pins defined in SEMI E57-0600. The support stand 18 supports the pod 2 from the bottom, while these receiver kinematic pins 19 are inserted into the respective positioning holes 5 of the pod 2. The elevator drive unit 16 raises and lowers this support stand 18 by the shaft 17.

The support stand 18 functions as a support unit for holding the bottom of the pod 2 and also serves as a storage container placement unit.

A sealed case 21 is mounted on the inner side of the front wall 11a of the main case 11 serving as a partition wall for separating the inner and outer sides of the main case 11 at a height corresponding to the load port 14 on the lower side than the pod loading opening 12. The sealed case 21 makes up a load lock chamber 20. The load lock chamber 20 makes up a storage container lid opening and closing chamber capable of being filled with an inert gas such as nitrogen gas. The load lock chamber 20 is also called "an opening and closing chamber".

An inert gas (nitrogen gas) supply device 132 and an exhaust device 133 are each connected to the sealed case 21 as shown in FIG. 2. The inert gas (nitrogen gas) supply device 132 supplies inert gas (nitrogen gas) into the load lock chamber 20, and the exhaust device 133 exhausts the inert gas.

A door loading and unloading opening 22 is formed on the front wall 11a of the main case 11 facing the upper side of the load lock chamber 20. This door loading and unloading opening 22 is formed to a size, matching the wafer loading and unloading opening 3 (somewhat larger than wafer loading and unloading opening 3) for the pod 2 placed in the load port 14.

A pod opener 23 is installed as a storage container lid opening and closing unit (also called "an attaching and detaching device") inside the load lock chamber 20. This pod opener 23 opens and closes the door loading and unloading opening 22 and the wafer loading and unloading opening 3 by attaching the door 4 to the pod 2, and removing the door 4 from the pod 2 placed in the load port 14.

The pod opener 23 includes a mobile stand 25 and a closure 26 supported by the mobile stand 25. The mobile stand 25 moves forward and rearward (vertically) and up and down (parallel direction) relative to the door loading and unloading opening 22. The closure 26 functions as a lid support unit for holding the door 4. The pod opener 23 opens and closes the door loading and unloading opening 22 and the wafer loading and unloading opening 3 of the pod 2 by holding the door 4 via the closure 26 and shifting forward and backward.

A mapping device 27 serving as a substrate state detector unit is installed at a position facing the door loading and unloading opening 22 in the sealed case 21.

This mapping device 27 contains a linear actuator 28 functioning as the drive source, a holder 29, and multiple sensors 30. The linear actuator 28 moves the holder 29 forward and rearward relative to the wafer loading and unloading opening 3 of the pod 2. The holder 29 holds the sensors 30. The mapping device 27 detects the wafers 1 within the pod 2 by the sensors 30. The mapping device 27 in this way detects whether or not the wafers 1 are being held in the each slot within the pod 2.

A pod storage chamber 11b is formed in the front side area within the main case 11. The storage chamber is provided adjacent to the load port. A swivel pod rack 31 functioning as a storage rack for storing the storage containers within the case is installed in the upper space in approximately the center section facing front and rear in the pod storage chamber 11b. The swivel pod rack 31 stores the multiple pods 2.

The swivel pod rack 31 includes multiple rack plates 33 and a support pillar 32. The support pillar 32 is erected perpendicularly and is rotated intermittently within the horizontal plane. The multiple rack plates 33 are affixed at positions on the top, mid and bottom levels on the support pillar 32 along the radius. These multiple rack plates 33 can support the multiple pods 2 respectively.

Multiple rack plate kinematic pins 34 are affixed protruding from the upper surface of the rack plate 33. These rack plate kinematic pins 34 are inserted into the positioning holes 5 of the pod 2. These rack plate kinematic pins 34 in other words, are the positioning means (also called "the positioning unit"). These rack plate kinematic pins 34 are equivalent to the primary pins defined in SEMI E57-0600.

A pod transfer device 35 is installed as the storage container transfer unit within the pod storage chamber 11b of the main case 11. This pod transfer device 35 transfers the pod 2 between the load port 14 and the swivel pod rack 31 by way of the pod loading opening 12. The pod transfer device 35 in other words transfers the pod between the storage chamber and the load port.

This pod transfer device 35 is made up of a pod transfer elevator 35a serving as the storage container elevator mechanism, and a pod transfer mechanism 35b serving as the storage container transfer mechanism.

The pod transfer device 35 transfers the pod 2 between the support stand 18, the swivel pod rack 31, and a placement stand 43 of a pod opener 42 described later by consecutively operating the pod transfer elevator 35a and the pod transfer mechanism 35b.

As shown in FIG. 2, a sub-case 40 is constructed across the rear end in the lower part of the approximate center section facing frontward and rearward within the main case 11.

A pair of wafer loading and unloading openings 41, 41 are formed on a front wall 40a of the sub-case 40, arrayed vertically in two stages made up of an upper and lower stages. The wafer loading and unloading openings (hereinafter called "wafer loading openings") 41 are openings for carrying the wafers 1 from the pod 2 into the sub-case 40, and into the pod 2 from inside the sub-case 40. The pair of pod openers 42, 42 are each installed as storage container lid opening and closing units in the wafer loading openings 41, 41 at the top and bottom stages.

The pod opener 42 contains a placement stand 43 for placing the pod 2, and an attaching and detaching mechanism 44 for attaching and detaching the door 4 of the pod 2. By using the attaching and detaching mechanism 44 to attach or detach the door 4 of the pod 2 mounted on the placement stand 43, the pod opener 42 can open or close the wafer loading and unloading opening 3 of the pod 2.

The sub-case 40 makes up a prechamber 45. This prechamber 45 is isolated from the flow in the storage chamber 11b where the pod transfer device 35 and the swivel pod rack 31 are installed.

A wafer transfer mechanism 46 is installed in the front side area of the prechamber 45. This wafer transfer mechanism 46 includes a wafer transfer device 46a and a wafer transfer device elevator 46b and a tweezers 46c. The wafer transfer device elevator 46b is installed at the right end section in the front area within the prechamber 45. The wafer transfer device elevator 46b raises and lowers the wafer transfer device 46a. This wafer transfer device 46a advances linearly or swivels the tweezers 46c within a horizontal plane. The tweezers 46c hold the wafers 1.

The wafer transfer mechanism 46 transfers the wafers 1 held in the tweezers 46c from the pod 2 to a boat (substrate holding jig) 47 to charge the wafers by continuously operating the wafer transfer device 46a and the wafer transfer device elevator 46b. The wafer transfer mechanism 46 discharges the wafers 1 held in the tweezers 46c from the boat 47 by continuously operating the wafer transfer device 46a and the wafer transfer device elevator 46b to transfer and store the wafers from the boat 47 into the pod 2.

The controller 77 regulates the operation of all units within the batch CVD apparatus including the load port 14, the pod elevator 15, the pod opener 23, the mapping device 27, the swivel pod rack 31, the pod transfer device 35, the pod opener 42, and the wafer transfer mechanism 46, etc.

A boat elevator 48 for raising and lowering the boat 47 is installed in the rear side area of the prechamber 45.

An arm 49 functioning as a linkage is connected to the elevator stand of the boat elevator 48. A seal cap 50 is installed horizontally on the arm 49. This seal cap 50 supports the boat 47 perpendicularly and seals the bottom end of a processing furnace 51 described later.

The boat 47 functioning as the substrate holding jig contains multiple pieces of support members. These multiple support member pieces respectively support the multiple wafers 1 (for example approximately 50to 125 wafers) horizontally. In other words, the multiple wafers 1 held in the boat 47 are arrayed perpendicularly while the centers of the wafers 1 are aligned.

Though omitted from the drawings for the sake of convenience, a clean gas supply unit (hereinafter called "clean unit") is installed on the left side end section of the prechamber 45 which is the side opposite the boat elevator 48 side and the wafer transfer device elevator 46b side. This clean unit is made up of a supply fan and a dust-preventive filter. The clean unit supplies a clean air (also called "clean gas") which is a purified atmosphere or inert gas.

A notch aligner device is installed between the wafer transfer device 46a and the clean unit. The notch aligner device is a substrate aligner device for aligning the circumferential position of the wafers.

The clean air blown out from the clean unit passes through the notch aligner device, the wafer transfer device 46a and the boat 47, and is then suctioned via ducts not shown in the drawing. The suctioned clean air is exhausted outside the main case 11 or is recirculated to the primary side (supply side) which is the suction side of the cleaning unit and blown again into the prechamber 45 by the clean unit.

Figure 4:
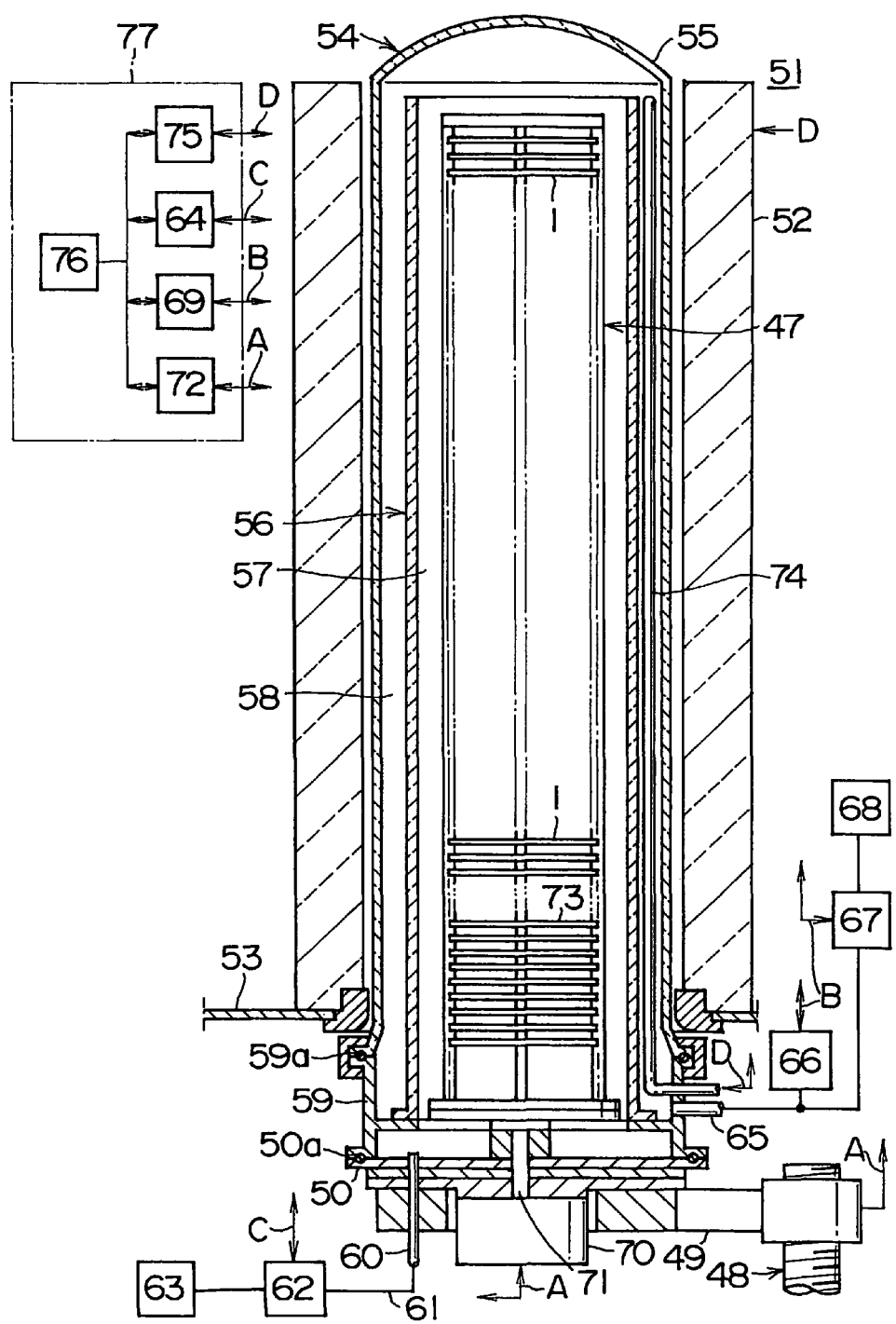
FIG. 4 is a vertical cross sectional view showing the processing furnace.

A processing furnace 51 shown in FIG. 4 is installed on the sub-case 40.

As shown in FIG. 4, the processing furnace 51 contains a heater 52 as the heating mechanism.

This heater 52 is a cylindrical shape, and is installed perpendicularly supported by the heater base 53 as the support plate.

A process tube 54 serving as the reaction tube is installed concentrically with the heater 52 and on the inner side of the heater 52. This process tube 54 includes an outer tube 55 as the external reaction tube, and an inner tube 56 as the internal reaction tube installed on the inner side of the outer tube 55.

The outer tube 55 is formed from a heat-resistant material such as quartz ($SiO_2$) or silicon carbide (SiC). The outer tube 55 has an inner diameter larger than the outer diameter of the inner tube 56, and is formed in a cylindrical shape with the top end sealed and the bottom end open. This outer tube 55 is formed concentrically with the inner tube 56.

The inner tube 56 is formed from a heat-resistant material such as quartz or silicon carbide. The inner tube 56 is formed in a cylindrical shape open at the bottom end and the top end. The cylindrical hollow space inside the inner tube 56 forms a processing chamber 57. The processing chamber 57 is capable of storing the boat 47 while holding the wafers 1 horizontally and aligned in multiple stages vertically.

The gap between the outer tube 55 and the inner tube 56 forms a tubular space 58.

A manifold 59 formed concentrically with the outer tube 55 is installed below the outer tube 55. The manifold 59 is for example formed from stainless steel. This manifold 59 is formed in a cylindrical shape open at the top end and the bottom end. This manifold 59 is linked to and supports the outer tube 55 and the inner tube 56.

The heater base 53 supports the manifold 59, and the process tube 54 is installed perpendicularly.

The process tube 54 and the manifold 59 form a reaction container.

An O-ring 59a is installed as a sealing member between the manifold 59 and the outer tube 55.

A nozzle 60 as a gas feed unit connects to the seal cap 50. This nozzle 60 connects to the interior of the processing chamber 57. A gas supply pipe 61 connects to this nozzle 60.

A MFC (mass flow controller) 62 connects to the side (upstream side) opposite the side connecting to the nozzle 60 on the gas supply pipe 61. A gas supply source 63 connects to the side opposite the connection side of the gas supply pipe 61 on the MFC 62. This MFC 62 is a gas flow rate control device. The gas supply source 63 supplies the desired gas such as process gas or inert gas.

A gas flow rate control unit 64 is electrically connected by an electrical wire C to the MFC 62. This gas flow rate control unit 64 controls the MFC 62 so that the gas is supplied at a specified timing and also at a specified flow rate.

An exhaust pipe 65 is installed on the manifold 59 for evacuating the atmosphere within the processing chamber 57. The exhaust pipe 65 is installed on the bottom end of the tubular space 58 formed by the gap between the inner tube 56 and the outer tube 55 and connects to this tubular space 58.

A pressure sensor 66 functioning as pressure sensors and a pressure regulator device 67 are connected to the downstream side of the exhaust pipe 65 which is the side opposite the side connecting to the manifold 59.

An exhaust device 68 such as a vacuum pump is connected to the side opposite the side connecting to the pressure regulator device 67 on the exhaust pipe 65. The exhaust device 68 exhausts the interior of the processing chamber 57 to a specified pressure (vacuum intensity) by way of the exhaust pipe 65 and the pressure sensor 66, and the pressure regulator device 67.

A pressure regulator unit 69 electrically connects by way of an electrical wire B to the pressure sensor 66 and the pressure regulator device 67. The pressure regulator unit 69 controls the pressure regulator device 67 by utilizing a specified timing so that the pressure within the processing chamber 57 reaches a specified pressure based on the pressure detected by the pressure sensor 66.

The seal cap 50 seals the lower end of the manifold 59 perpendicularly from the lower side. This seal cap 50 makes up a furnace opening lid capable of sealing the lower end opening on the manifold 59.

The seal cap 50 is for example made from a metal such as stainless steel and is formed in a disk shape. An O-ring 50a is installed as a sealing member on the upper surface of the seal cap 50. This O-ring 50a directly contacts the bottom end of the manifold 59.

A swivel mechanism 70 to make the boat rotate is installed on the side opposite the processing chamber 57 of the seal cap 50. A rotating shaft 71 of the swivel mechanism 70 passes through the seal cap 50 and connects to the boat 47. The rotating shaft 71 makes the boat 47 rotate to rotate the wafers 1.

A drive control unit 72 electrically connects by way of an electrical wire A to the swivel mechanism 70 and the boat elevator 48. The drive control unit 72 controls the swivel mechanism 70 and the boat elevator 48 to perform the specified operation and moreover at the specified timing.

The boat 47 is formed for example from a heat resistant material such as quartz or silicon carbide. The boat 47 supports the multiple wafers 1 in a horizontal state and in multiple stages in a state where the centers of the wafers 1 are aligned.

Multiple heat-insulating plates 73 are positioned in a horizontal state and in multiple stages at the bottom of the boat 47. These heat-insulating plates 73 are formed of a heat resistant material such as quartz or silicon carbide, and are formed in a disk shape. The heat-insulating plates 73 are a heat-insulating member. These multiple heat-insulating plates 73 do not allow heat to easily propagate from the heater 52 to the manifold 59 side.

A temperature sensor 74 is mounted inside the process tube 54. This temperature sensor 74 is a temperature sensing device. A temperature regulator 75 electrically connects by way of an electrical wire D to the temperature sensor 74 and the heater 52.

The temperature regulator 75 adjusts the electrical power supplied to the heater 52 based on temperature information detected by the temperature sensors 74, to regulate the heater 52 with a specified timing and also in order to make the temperature within the processing chamber 57 reach a desired temperature distribution.

The gas flow rate control unit 64, the pressure regulator unit 69, the drive regulator unit 72, and the temperature regulator unit 75 together make up the operating units and the input units. These units are all electrically connected to a main control unit 76 that regulates the operation of the entire batch CVD apparatus.

A controller 77 includes the gas flow rate control unit 64, the pressure regulator unit 69, the drive regulator unit 72, the temperature regulator unit 75, and the main control unit 76.

An example of the film-forming processing in the IC manufacturing method of an embodiment of the present invention when using the above described batch CVD apparatus is described next.

In the following description, the controller 77 regulates the operation of each unit making up the batch CVD apparatus.

As shown in FIG. 1 through FIG. 3, the pod 2 is placed on the support stand 18 when the pod 2 is carried into the load port 14.

If the in-process transfer device is the AGV 9 as shown in FIG. 1, then the AGV 9 transfers the pod 2 onto the support stand 18 by way of the front opening 14C. If the in-process transfer device is a ceiling track overhead hoist transport, then this ceiling track overhead hoist transport transfers the pod 2 to the support stand 18 by way of the ceiling opening 14B.

The pod 2 is at that time positioned on the support stand 18 by inserting the receiver kinematic pins 19 affixed to the support stand 18, into the positioning holes 5 on the lower surface of the pod 2.

As shown next in FIG. 5A, in the load port 14 the pod 2 is moved towards the pod opener 23, and the closure 26 of the pod opener 23 supports the door 4.

The inert gas supply device 132 at this time supplies inert gas into the load lock chamber 20 to form an inert gas atmosphere.

When the closure 26 supports the door 4, the rearward movement of the mobile stand 25 detaches the door 4 from the wafer loading and unloading opening 3.

As then shown in FIG. 5B, the mobile stand 25 lowers to cause the closure 26 to separate from the wafer loading and unloading opening 3 position within the load lock chamber 20.

When the wafer loading and unloading opening 3 is opened as shown in FIG. 5B, the linear actuator 28 inserts the holder 29 of the mapping device 27 into the wafer loading and unloading opening 3. The sensor 30 of the mapping device 27 commences mapping of the wafers 1 inside the pod 2.

The inert gas supply device 132 at this time supplies inert gas into the load lock chamber 20 and the exhaust device 133 exhausts the interior of the load lock chamber 20 so that the atmosphere within the pod 2 is replaced with inert gas.

After the specified mapping is completed, the linear actuator 28 returns the holder 29 of the mapping device 27 from the wafer loading and unloading opening 3 back to the original standby position.

When the holder 29 returns to standby position, the rising of the mobile stand 25 moves the closure 26 to the wafer loading and unloading opening 3.

As shown in FIG. 5A, the mobile stand 25 then advances towards the wafer loading and unloading opening 3, to make the closure 26 install the door 4 on the wafer loading and unloading opening 3.

If there is a difference between the mapping information readout by this mapping device 27, and the mapping information already provided for this pod 2, then the pod 2 where the difference was discovered is promptly transferred from the load port 14, by the in-process transfer device such as the AGV 9 shown in FIG. 1, to the previous process or to the wafer array process.

Sending the pod 2 immediately back from the load port 14 in this way when the mapping information read by the mapping device 27 is discovered to be different from the pre-provided mapping information drastically reduces the number of steps compared to the case when returning the pod 2 to the load port 14 and sending the pod 2 back after carrying the pod 2 in particular into the swivel pod rack 31 or the placement stand 43 inside the main case 11. Immediately sending back the pod 2 therefore prevents having to increase the time needed for placing wafers into the boat 47 and having to increase the standby time prior to starting the wafer processing.

Figure 6:
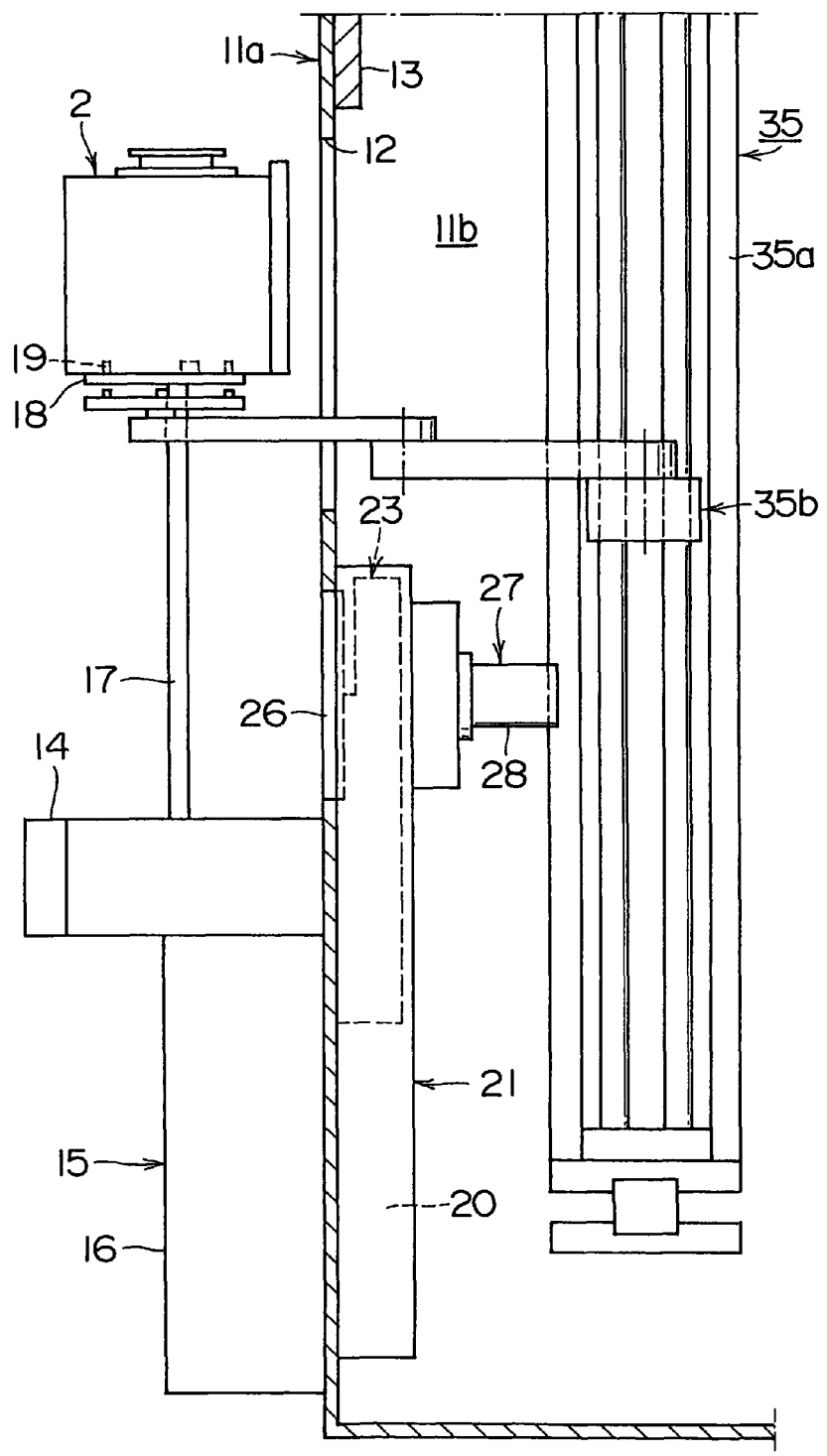
FIG. 6 is a partially omitted side cross sectional view showing carry-in of the pod.

When the mapping information read by the mapping device 27 matches the mapping information already provided for the pod 2, then as shown in FIG. 6, the pod elevator 15 raises the pod 2 supported on the support stand 18, from the load port 14 to a height equal to that of the pod loading opening 12.

More specifically, the support stand 18 is raised to a height above the sealed case 21, where the pod transfer mechanism 35b can scoop up the pod 2 from the lower side.

The front shutter 13 opens the pod loading opening 12 when the pod 2 is raised to the height of the pod loading opening 12.

The pod transfer mechanism 35b of the pod transfer device 35 next is inserted into the pod loading opening 12, and as shown in FIG. 6, the pod transfer mechanism 35b scoops up the pod 2 supported by the support stand 18.

In other words, as shown in FIG. 7 the arm 35c of the pod transfer mechanism 35b extends, to make the plate 35d supported on the tip of the arm 35c pass through the pod loading opening 12, and advance directly under the support stand 18. The plate 35d functions as the holding unit.

Next, the pod transfer elevator 35a rises to make the plate 35d scoop up the pod 2 from above the support stand 18.

Three plate kinematic pins 35e of the plate 35d are at this time respectively inserted into the inner positions in the three positioning holes 5 as shown by the phantom lines in FIG. 7. These plate kinematic pins 35e are equivalent to the secondary pins defined in SEMI E57-0600.

The pod 2 that was scooped up by the pod transfer mechanism 35b as described above is carried into the main case 11 from the pod loading opening 12 by the contraction of the arm 35c of the pod transfer mechanism 35b.

The pod transfer mechanism 35 as shown in FIG. 1 and FIG. 2 automatically transfers and delivers the pod 2 to the specified rack plate 33 of the swivel pod rack 31.

Insertion of the rack plate kinematic pins 34 of the rack plate 33 into the positioning holes 5 on the lower side of the pod 2 at this time sets a state where the pod 2 is positioned and held by the rack plate 33.

The rack plate 33 temporarily holds the pod 2. The pod transfer mechanism 35 then transfers the pod 2 from the rack plate 33 to the pod opener 42 installed in one of the wafer loading openings 41 and transfers it to the placement stand 43.

The wafer loading opening 41 of the pod opener 42 is at this time closed by the attaching and detaching mechanism 44. The clean air unit makes clean air flows in to fill the prechamber 45.

For example, nitrogen gas serving as the clean air is filled into the prechamber 45. The oxygen concentration in the prechamber 45 at this time is 20 ppm or less, which is much lower than the oxygen concentration in the interior (air atmosphere) of the main case 11.

After the pod transfer mechanism 35b carries the pod 2 from the pod loading opening 12 into the main case 11, the pod 2 may also be directly transferred to the pod opener 42 mounted on the wafer loading opening 41.

The open side of the pod 2 placed on the placement stand 43 is then pressed against the open side edges of the wafer loading opening 41 on the front wall 40a by the pod opener 42. The attaching and detaching mechanism 44 then detaches the door 4, and opens the wafer loading and unloading opening 3.

In this case, mapping in the load port 14 has already been completed so that the mapping of the wafer 1 group within the pod 2 can be omitted.

The pod 2 has already been filled with inert gas which can prevent a rise in the oxygen concentration within the prechamber 45.

When the pod opener 42 opens the pod 2, the wafer transfer mechanism 46 picks up the wafers 1 with the tweezers 46c of the wafer transfer device 46a from the pod 2 by way of the wafer loading and unloading opening 3 and transfers them to a notch aligner device (not shown in drawing). This notch aligner device aligns the position of the wafers 1. After alignment, the wafer transfer mechanism 46 picks up the wafers 1 from the notch aligner device with the tweezers 46c and transfers them to the boat 47. The wafer transfer mechanism 46 then charges the wafers 1 into the boat 47.

The wafer transfer mechanism 46 returns the wafer transfer device 46a that delivered the wafers 1 into the boat 47 to the pod 2 and starts the step of charging the next wafers 1 into the boat 47.

While the wafer transfer mechanism 46 is charging the wafers 1 into the boat 47 in one (top stage or bottom stage) of the pod openers 42, the pod transfer device 35 is transferring another pod 2 from the swivel pod rack 31 to the other pod opener 42 (bottom stage or top stage). The process of opening the pod 2 transferred to the other pod opener 42 proceeds simultaneously.

The lower end portion of the processing furnace 51 that was closed is opened by a furnace shutter (not shown in drawing) when the pre-specified number of wafers 1 are charged into the boat 47.

The boat elevator 48 then raises the seal cap 50 to load the boat 47 holding the wafer 1 group into the processing furnace 51.

The method for forming the thin film on the wafers 1 using the processing furnace 51 and the CVD method is described next.

In the following description, the controller 77 controls the operation of each unit in the processing furnace 51.

After the multiple wafers 1 have been charged into the boat 47, the boat elevator 48 raises the boat 47 holding the multiple wafers 1, to load the boat into the processing chamber 57 as shown in FIG. 4.

While in this state, the seal cap 50 maintains the bottom end of the manifold 59 in a sealed state by way of the O-ring 50a.

The vacuum exhaust device 68 exhausts the interior of the processing chamber 57 to reach the specified pressure (vacuum intensity). The pressure sensor 66 at this time measures the pressure inside the processing chamber 57. The feed back control based on the measured pressure is performed on the pressure regulator device 67.

The heater 52 heats the interior of the processing chamber 57 to reach the specified temperature. The temperature sensor 74 at this time detects the temperature within the processing chamber 57. The electrical power applied to the heater 52 is regulated at this time by feedback based on the temperature information that was detected, so as to attain a specified temperature distribution within the processing chamber 57.

The swivel mechanism 70 next rotates the boat 47 to swivel the wafers 1.

The gas supplied from the gas supply source 63 and regulated to a specified flow rate by the MFC 62 is next fed into the processing chamber 57 from the nozzle 60 after flowing through the gas supply pipe 61.

The fed gas rises in the processing chamber 57, and flows from the upper end opening of the inner tube 56 into the tubular space 58, and is exhausted from the exhaust pipe 65.

The gas makes contact with the surface of the wafers 1 when passing through the interior of the processing chamber 57. A thin film in this way is formed by a thermal CVD reaction onto the surfaces of the wafers 1.

After a pre-specified processing time has elapsed, inert gas is supplied from the gas supply source 63 by way of the gas supply pipe 61 into the interior of the processing chamber 57, and along with replacing the atmosphere in the processing chamber 57 with inert gas, the interior of the processing chamber 57 is restored to the usual pressure.

The boat elevator 48 then lowers the seal cap 50, the bottom end of the manifold 59 is opened, and the boat 47 holding the processed wafers 1 is unloaded from the bottom end of the manifold 59 to outside the process tube 54.

The wafer transfer device 46a discharges the processed wafers 1 on the unloaded boat 47 from the boat 47, and returns them in an empty pod 2 pre-transferred to the pod opener 42.

When a specified number of processed wafers 1 have been stored, the pod opener 42 attaches the door 4 onto the wafer loading and unloading opening 3 of the pod 2.

The pod transfer device 35 automatically transfers the pod 2 whose wafer loading and unloading opening 3 is closed, to the specified rack plate 33 of the swivel pod rack 31.

The pod 2 is temporarily stored on the rack plate 33.

The front shutter 13 then opens the pod loading opening 12. The pod transfer device 35 transfers the pod 2 from the rack plate 33 to the pod loading opening 12, and delivers through the pod loading opening 12 on the support stand 18 of the boat elevator 15.

The pod transfer device 35 may also directly transfer the pod 2 storing the processed wafers 1, from the pod opener 42 to the pod loading opening 12.

The front shutter 13 closes the pod loading opening 12 when the pod 2 is delivered to the support stand 18. The elevator drive unit 16 lowers the shaft 17 of the pod elevator 15 onto the load port 14.

An in-process transfer device such as the AGV 9 shown in FIG. 1 transfers the pod 2 that was lowered onto the load port 14 to the specified process.

The present embodiment as described above renders one or more of the following effects.

1) Installing a mapping device in the load port where the pod is carried in by the in-process transfer device, allows sending the pod promptly back from the load port when a mismatch is found between the actual mapping information read by the mapping device and the pre-supplied map information. Therefore, compared to the method of the conventional art where a mapping device is installed in the pod opener within the case, the present invention renders the effect that the delay in starting the wafer processing due to discovering a mismatch in the map information can be shortened by an amount of time equal to the time saved from eliminating the task of returning the pod to the load port to send it back after having loaded it in the case.

2) Installing a pod loading opening above the load port, and installing a pod elevator to raise and lower a support stand holding the pod from below, between the load port and the pod loading opening allows making a simpler and smaller handling structure compared to handling that grips the upper section of the pod. The apparatus can therefore be made smaller and lighter, simpler, faster, with better safety and more effective use of space.

3) Installing receiver kinematic pins on the support stand raised and lowered by the pod elevator allows setting the support stand at transfer reference for each pod placement unit. Therefore, common transfer reference standards can be attained.

4) The pod might be left standing for long periods even if storing wafers and in those cases the oxygen concentration might reach high levels within the pod. In those cases, if the lid is opened in the placement stand 43, the inert gas atmosphere (low oxygen concentration atmosphere) within the large capacity prechamber then deteriorates. Time was then needed to restore the prechamber to an inert gas atmosphere. However, the throughput can be boosted by using the sealed case 21 whose capacity is smaller than the prechamber, to set the interior of the pod to an inert gas atmosphere before opening the lid of the pod in the prechamber.

Figure 9:
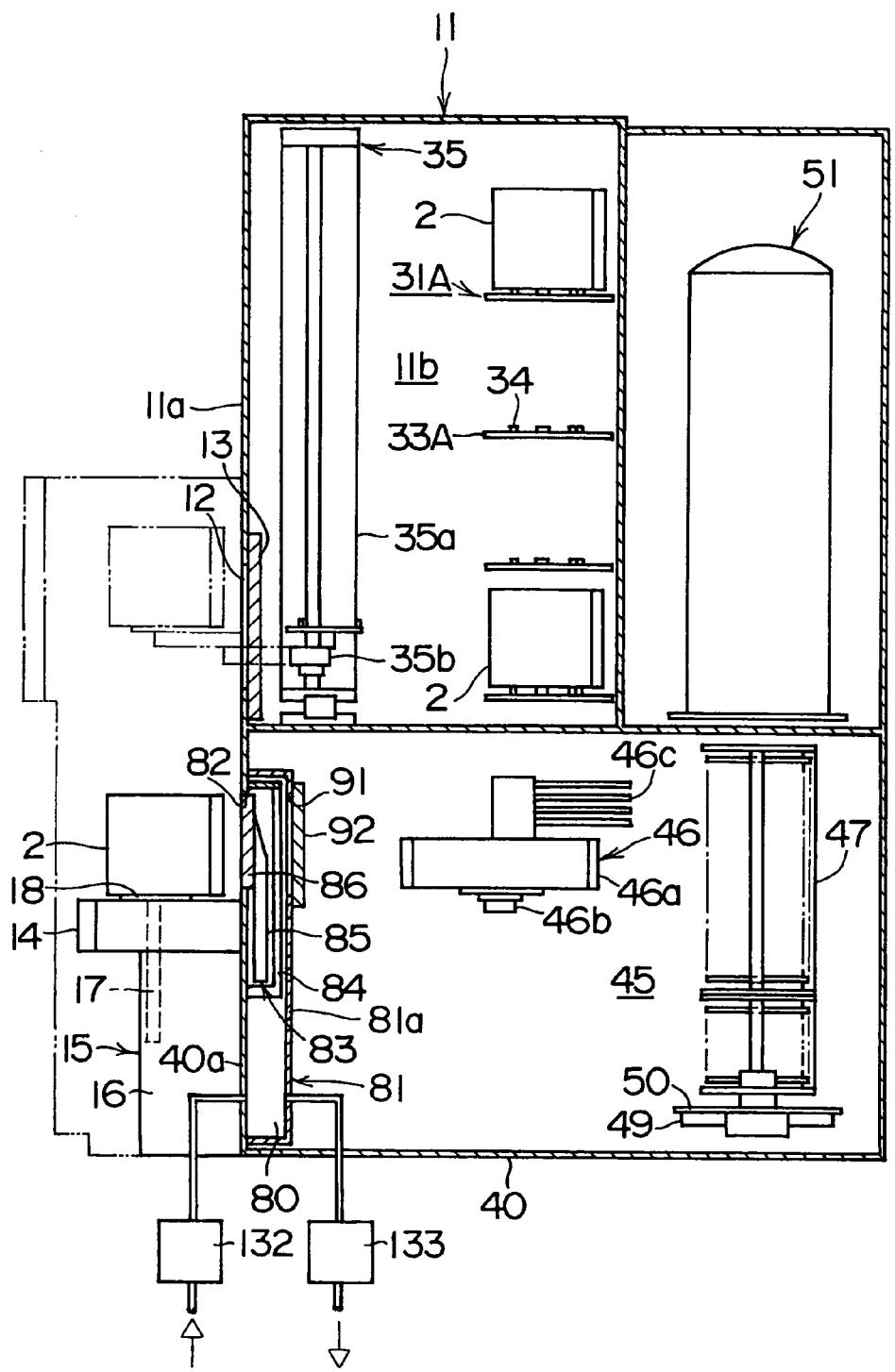
FIG. 9 is a perspective view showing a main section of the batch CVD apparatus of the second embodiment of the present invention.

FIG. 9 is a side cross sectional view showing the batch CVD apparatus in the second embodiment of the present invention.

The point where the present embodiment differs from the previous embodiment is that, the pod opener is installed only in the load port.

In other words, as shown in FIG. 9, the load port 14 is provided in the front wall (partition wall) 40a of the sub-case 40 forming the prechamber 45. A wafer loading and unloading opening (hereinafter called "wafer loading opening") 91 is formed in a rear wall 81a of a sealed case 81 forming a load lock chamber 80 of a pod opener 83 installed on the front wall 40a. A door mechanism 92 for opening and closing this wafer loading opening 91 is also installed in this load port.

The wafer transfer mechanism 46 serving as the substrate transfer device is installed inside the prechamber 45. The wafer transfer mechanism 46 transfers the wafer 1 between the pod 2 and the boat 47 while the door mechanism 92 has opened the wafer loading opening 91.

The boat elevator 48 loads the boat 47 into the processing chamber 57 of the processing furnace 51 adjacently to the prechamber 45, and unloads the boat 47 from the processing chamber 57.

A storage rack 31A and the pod transfer device 35 are installed in the storage chamber 11b adjacent to the ceiling surface of the prechamber 45.

The pod loading opening 12 is formed in a section facing the storage chamber 11b on the front wall 11a of the main case 11. The front shutter 13 opens and closes the pod loading opening 12.

A mapping device 84 is installed in the load lock chamber 80 the same as the pod opener 23 of the first embodiment. The mapping device 84 can move forward and rearward (perpendicularly) and upward and downward (parallel) to a door loading and unloading opening 82.

An inert gas (nitrogen gas) supply device 132 and an exhaust device 133 are each connected to the sealed case 81. The inert gas (nitrogen gas) supply device 132 supplies inert gas (nitrogen gas) into the load lock chamber 80, and the exhaust device 133 exhausts the interior of the load lock chamber 80.

The operation of the pod opener for the above batch CVD apparatus is described next.

As shown in FIG. 9, the pod 2 is mounted on the support stand 18 of the pod elevator 15, when the pod 2 is carried into the load port 14.

The pod 2 is at that time positioned on the support stand 18 by insertion of the receiver kinematic pins 19 affixed to the support stand 18, into the positioning holes 5 on the lower surface of the pod 2.

The pod 2 is next moved towards the pod opener 83 in the load port 14. The pod opener 83 makes a closure 86 support the door 4.

The inert gas supply device 132 at this time supplies inert gas into the load lock chamber 80 to form an inert gas atmosphere.

When the closure 86 holds the door 4, a mobile stand 85 retreats, and the closure 86 removes the door 4 from the wafer loading and unloading opening 3 and the door loading and unloading opening 82. The mobile stand 85 then lowers within the load lock chamber 80, and the closure 86 then moves away from the wafer loading and unloading opening 3 and the door loading and unloading opening 82 positions.

When the pod opener 83 opens the wafer loading and unloading opening 3, the sensor of the mapping device 84 is inserted into the wafer loading and unloading opening 3. The sensor of the mapping device 84 then detects the wafers 1 within the pod 2 and maps the wafers 1.

The inert gas supply device 132 at this time continues supplying inert gas into the load lock chamber 80, and the exhaust device 133 exhausts the interior of the load lock chamber 80 so that the atmosphere within the pod 2 is replaced with inert gas.

When the specified mapping is finished, the mapping device is returned from the wafer loading and unloading opening 3 to the original standby position.

The mobile stand 85 then rises and the closure 86 is moved to the wafer loading and unloading opening 3 position. The mobile stand 85 moves forward toward the wafer loading and unloading opening 3, and the closure 86 attaches the door 4 to the wafer loading and unloading opening 3 and the door loading and unloading opening 82.

When the actual mapping information readout by this mapping device does not match the pre-supplied mapping information on the applicable pod 2, the pod 2 where the difference was discovered, is promptly transferred back from the load port 14 to the previous process or to the wafer array process.

When the actual mapping information readout by the above described mapping device does match the pre-supplied mapping information on the applicable pod 2, the pod elevator 15 raises the pod 2 supported on the support stand 18 from the load port 14 to the height of the pod loading opening 12.

When the pod 2 rises to the pod loading opening 12 height, the front shutter 13 opens the pod loading opening 12.

The pod transfer mechanism 35b of the pod transfer device 35 then scoops up the pod 2 supported by the support stand 18.

The pod transfer device 35 carries this pod 2 scooped up by the pod transfer mechanism 35b from the pod loading opening 12 into the main case 11.

The pod transfer device 35 automatically transfers this pod 2 and delivers it to the specified rack plate 33A of the storage rack 31A.

This pod 2 is then temporarily stored in the rack plate 33A.

Then in the reverse of the above procedure, the pod transfer device 35 and the pod elevator 15 transfer the pod 2 from the storage rack 31A to the load port 14.

Clean air at this time flows in to fill the prechamber 45.

Next, in the load port 14, the pod 2 is moved towards the pod opener 83. The closure 86 of the pod opener 83 supports the door 4.

When the closure 86 supports this door 4, the mobile stand 85 retreats to remove the door 4 from the wafer loading and unloading opening 3. The mobile stand 85 then lowers within the load lock chamber 80 to make the closure 86 separate from the wafer loading and unloading opening 3 and the door loading and unloading opening 82 positions.

When the wafer loading and unloading opening 3 is opened, the door mechanism 92 opens the wafer loading opening 91.

The mapping of the wafers within the pod has already been finished at this time so that a mapping can be omitted here.

The pod 2 is filled in advance with inert gas so that a rise in the oxygen concentration within the prechamber 45 can be prevented.

When the wafer loading and unloading opening 3, the door loading and unloading opening 82, and the wafer loading opening 91 are opened, the wafer transfer device 46a uses the tweezers 46c to pick up the wafers 1 from the pod 2 through the wafer loading and unloading opening 3, the wafer loading opening 91 and the door loading and unloading opening 82. The wafer transfer device 46a transfers the wafers 1 to the notch aligner device. This notch aligner device aligns the wafers 1. After notch alignment, the wafer transfer device 46a uses the tweezers 46c to pick up the wafers 1 from the notch aligner device. The wafer transfer device 46a transfers the picked up wafers 1 to the boat 47, and charges them into the boat 47.

The wafer transfer device 46a that delivered the wafers 1 to the boat 47, returns to the pod 2, and then charges the next wafers 1 into the boat 47.

The wafer transfer device 46a may also directly transfer the wafers 1 with the tweezers 46c from the pod 2 without performing the step of storing the pod 2 temporarily in the storage rack 31A. In other words, the wafer loading opening 91 is opened after mapping is completed and the mapping device returns its sensor to the original standby position from the wafer loading and unloading opening 3, or while mapping is in progress. Next, the wafer transfer device 46a inserts the tweezers 46c into the wafer loading opening 91, and picks up the wafers 1 from the pod 2.

The subsequent steps are the same as the previous embodiment so a description is omitted.

The present embodiment renders the following effects in addition to one or more effects of the first embodiment. A pod opener is installed in the load port which can help use space more efficiently (footprint is reduced) and can improve the throughput (pod movement range can be reduced).

Figure 10:
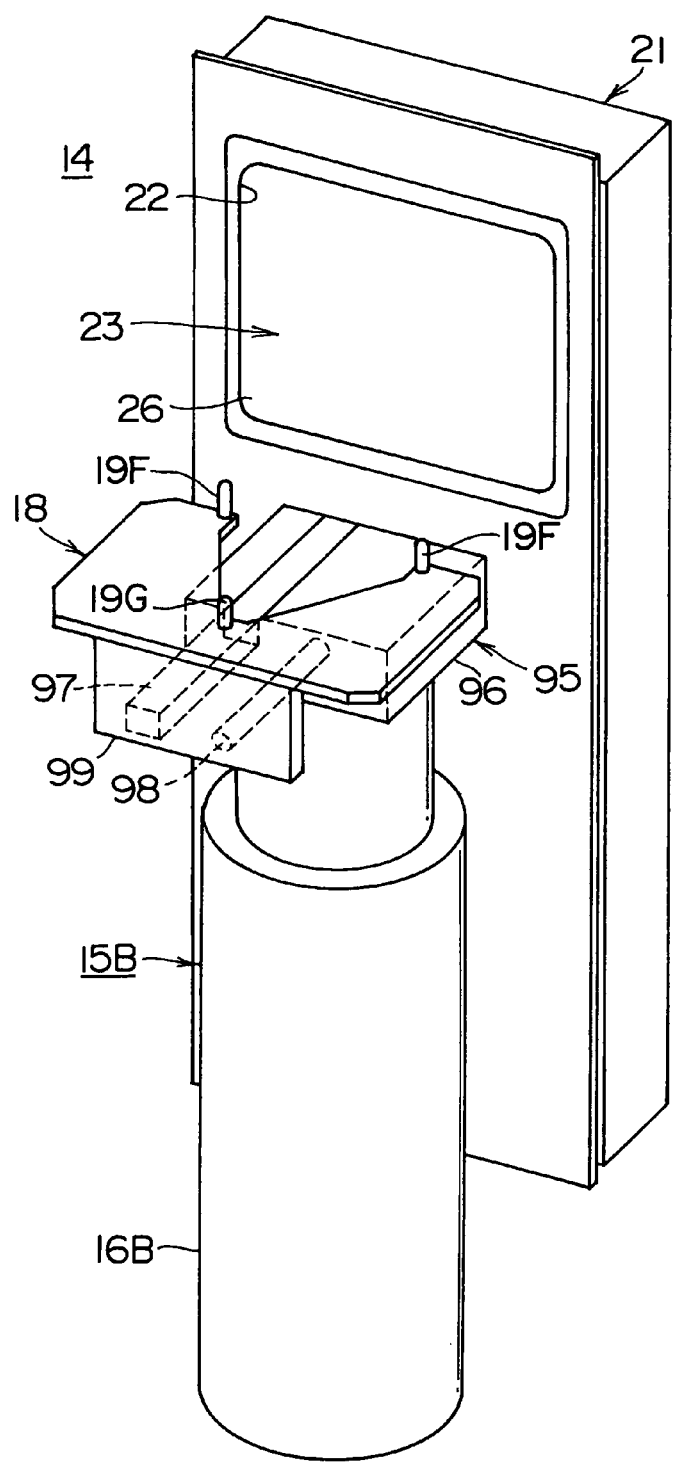
FIG. 10 is a perspective view showing the load port of the batch CVD apparatus of the third embodiment of the present invention.

FIG. 10 is a perspective view showing the load port of the batch CVD apparatus of the third embodiment of the present invention.

The present embodiment differs from the first embodiment in that a pod elevator 15B moves the support stand forward and rearward and up and down.

The shape of the support stand is identical to the first embodiment but is now explained in detail.

Namely, a main piece 96 of a linear actuator 95 is installed on the upper end of a shaft 17B of an elevator drive device 16B. This main piece 96 extends horizontally and also forward and rearward. The support stand 18 is installed horizontally by way of a guide 97, a drive rod 98 and a bracket 99 on the linear actuator 95. The guide 97 and the drive rod 98 extend and contract relative to the main piece 96 to move the support stand 18 horizontally and also back and forth. The linear actuator 95 and main piece 96 and guide 97 and drive rod 98 and bracket together make up the far-near moving device. This far-near moving device is not limited to this embodiment and may for example be the belt-driven type.

In other words, the support stand 18 need only be capable of moving away from and near the pod opener.

The support stand 18 contains a notch (also called "escape section") on the pod opener 23 side (also called "the door loading and unloading opening 22 side").

More specifically, the notch is formed between the two receiver kinematic pins 19F on the pod opener 23 side among the three receiver kinematic pins 19 for supporting the pod 2. The receiver kinematic pins 19 make up the positioning unit equivalent to the primary pin defined in SEMI E57-0600. When the pod 2 is mounted, the notch forms a space in a section of the bottom of the pod 2 and also is cut out on the pod opener 23 side from the one remaining receiver kinematic pin 19G.

The notch may be formed in a square, rectangular, circular or oval shape. The notch is preferably formed in a triangular shape. An optimal shape for the notch is the approximate equilateral triangular shape as shown in FIG. 10.

The notch on the support stand 18 forms a space on the pod opener 23 side, on a section of the pod bottom, when the pod is placed on the support stand 18.

The pod transfer device 35 in this way can prevent interference with the plate 35d and the support stand 18 during delivery of the pod 2 between the support stand 18 and the plate 35d.

The pod handling step using the pod elevator 15B of the above structure is described using FIG. 11A through FIG. 11D.

Other steps such as the mapping step in the process for mapping the wafers in the pods are the same as in the first embodiment so a description of these steps is omitted.

Figure 11:
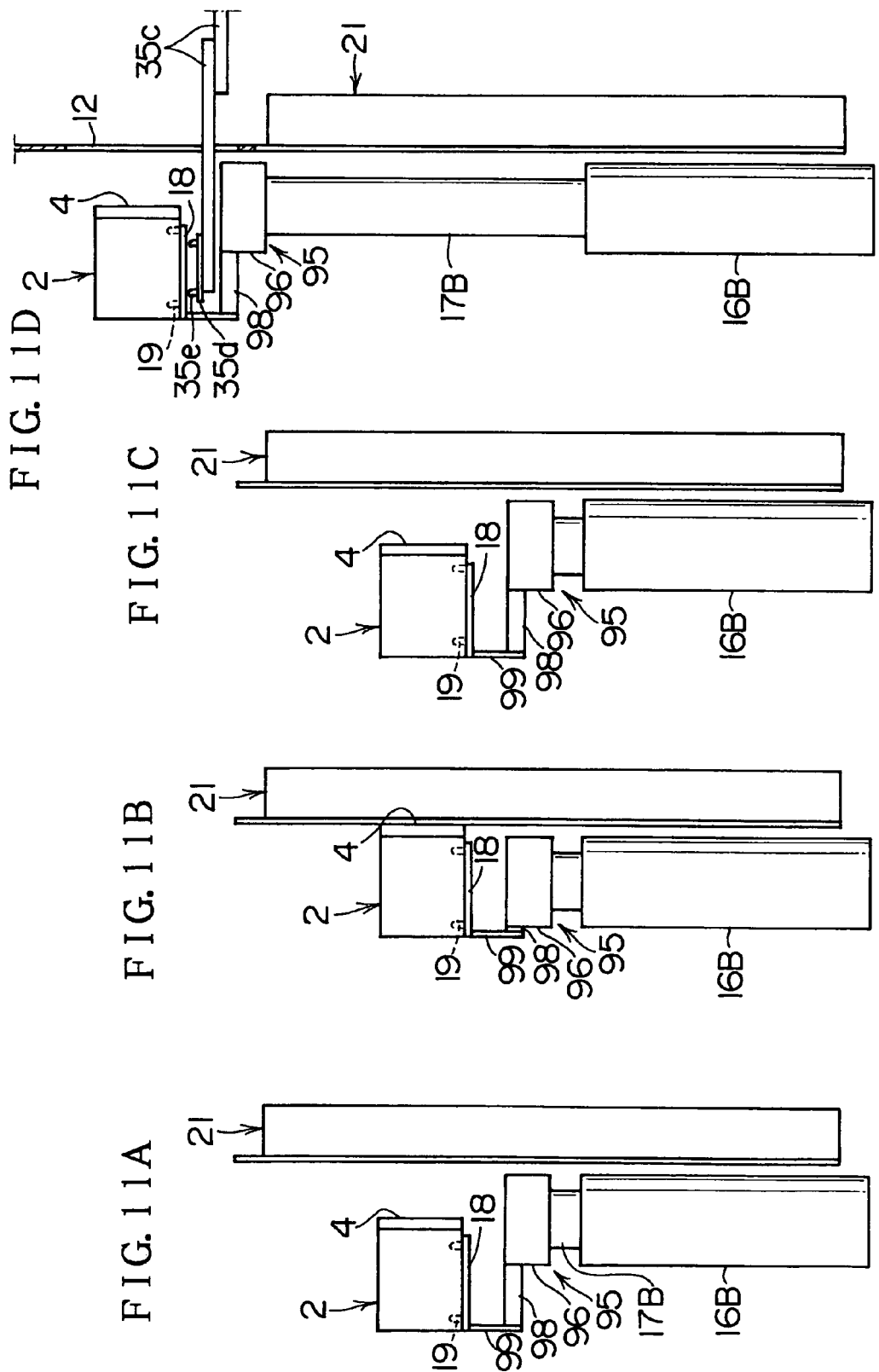
FIG. 11A through FIG. 11D are each concept side views for describing the operation.

The pod 2 transferred by an in-process transfer device such as an AGV 9, is placed on the support stand 18 as shown in FIG. 11A.

The pod 2 is positioned at this time in the support stand 18 by inserting the three receiver kinematic pins 19 of the support stand 18 in the respective outer side positions of the three positioning holes 5 (See FIG. 7) formed on the lower side of the pod 2.

Next as shown in FIG. 11B, the linear actuator 95 contracts to make the support stand 18 move along with the pod 2 near to the pod opener 23 (door loading and unloading opening 22) and make the closure 26 of the pod opener 23 support the door 4.

The mapping step is then performed according to the above described operation.

When the mapping is complete, the closure 26 attaches the door 4 onto the wafer loading and unloading opening 3.

Then as shown in FIG. 11C, the linear actuator 95 extends to make the support stand 18 move along with the pod 2 back to their original position.

When a mismatch is found between the mapping information read in the mapping step, and the mapping information relating to the pod 2 provided in advance, an in-process transfer device such as an AGV 9 promptly transfers the pod 2 where the mismatch was discovered, from the load port 14 to the previous process or to the wafer array process.

On the other hand, when the mapping information read in the mapping step matches the pre-supplied mapping information relating to the applicable pod 2, then as shown in FIG. 1D, the elevator drive device 16B makes the shaft 17B extend to raise the pod 2 held on the support stand 18, to the height of the pod loading opening 12 from the load port 14. The elevator drive device 16B raises and lowers the support stand 18 in parallel with the opening surface of the door loading and unloading opening 22.

The front shutter 13 opens the pod loading opening 12 when the pod 2 rises to the height of the pod loading opening 12.

Next, as shown in FIG. 7, when the pod transfer mechanism 35b extends the arm 35c, the plate 35d supported on the tip of the arm 35c passes through the pod loading opening 12, and enters directly underneath the support stand 18.

Next, the rising of the pod transfer elevator 35a causes the plate 35d to scoop up the pod 2 from the support stand 18.

The three plate kinematic pins 35e of the plate 35d are at this time inserted respectively into the inner positions of the receiver kinematic pins 19 on the three positioning holes 5.

The pod 2 scooped up by the pod transfer device 35b as described above, is therefore carried from the pod loading opening 12 into the main case 11 by the contraction of the arm 35c of the pod transfer device 35b.

The following steps are the same as the operation of the above described first embodiment.

The present embodiment as described above renders one or more of the following effects in addition to one or more effects of the first embodiment.

1) The plate of the transfer device can be easily inserted into the notch by way of the space between two pins among the receiver kinematic pins at the three locations on the outer plate when scooping up the pod since receiver kinematic pins (primary pins) are installed in a first placement unit capable of raising and lowering, and a notch is formed on the inner side on the first placement unit enclosed by the receiver kinematic pins.

2) The plate can easily access the lower surface of the pod when the plate of the transfer device scoops up the pod from the first placement unit since a notch is formed on the transfer device side of the first placement unit.

3) When the transfer device is inserted into the notch of the first placement unit, one of the receiver kinematic pins (primary pins), and one of the kinematic pins (secondary pins) in the plate of the transfer device are positioned in the same direction as the direction that the transfer device moves. In this type of case, the notch can be set on the inner side by making the kinematic pin in the first placement unit of the primary pin, and the pod can be delivered to a transfer device containing a secondary pin that can be inserted into this notch. Stable raising and lowering can be achieved by supporting the pod bottom circumference by the outer plate.

Figure 12:
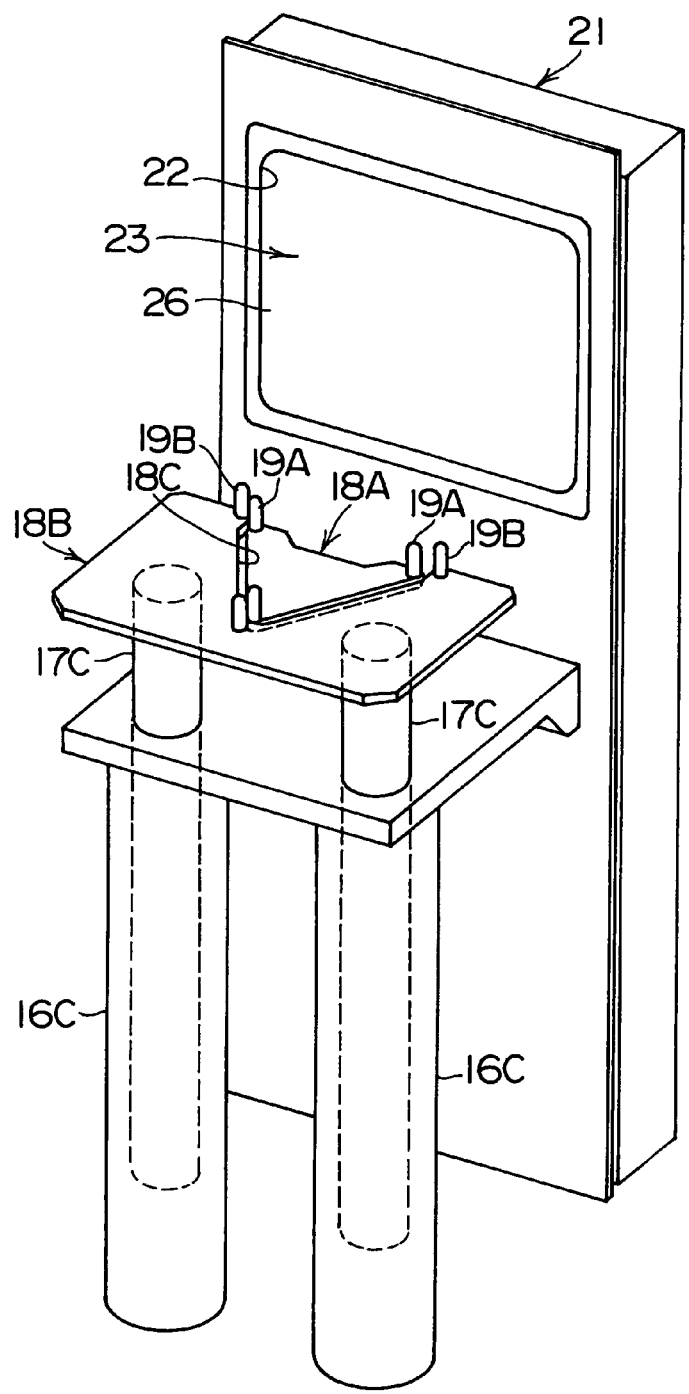
FIG. 12 is a perspective view showing the load port of the batch CVD apparatus of the fourth embodiment of the present invention.
Figure 13:
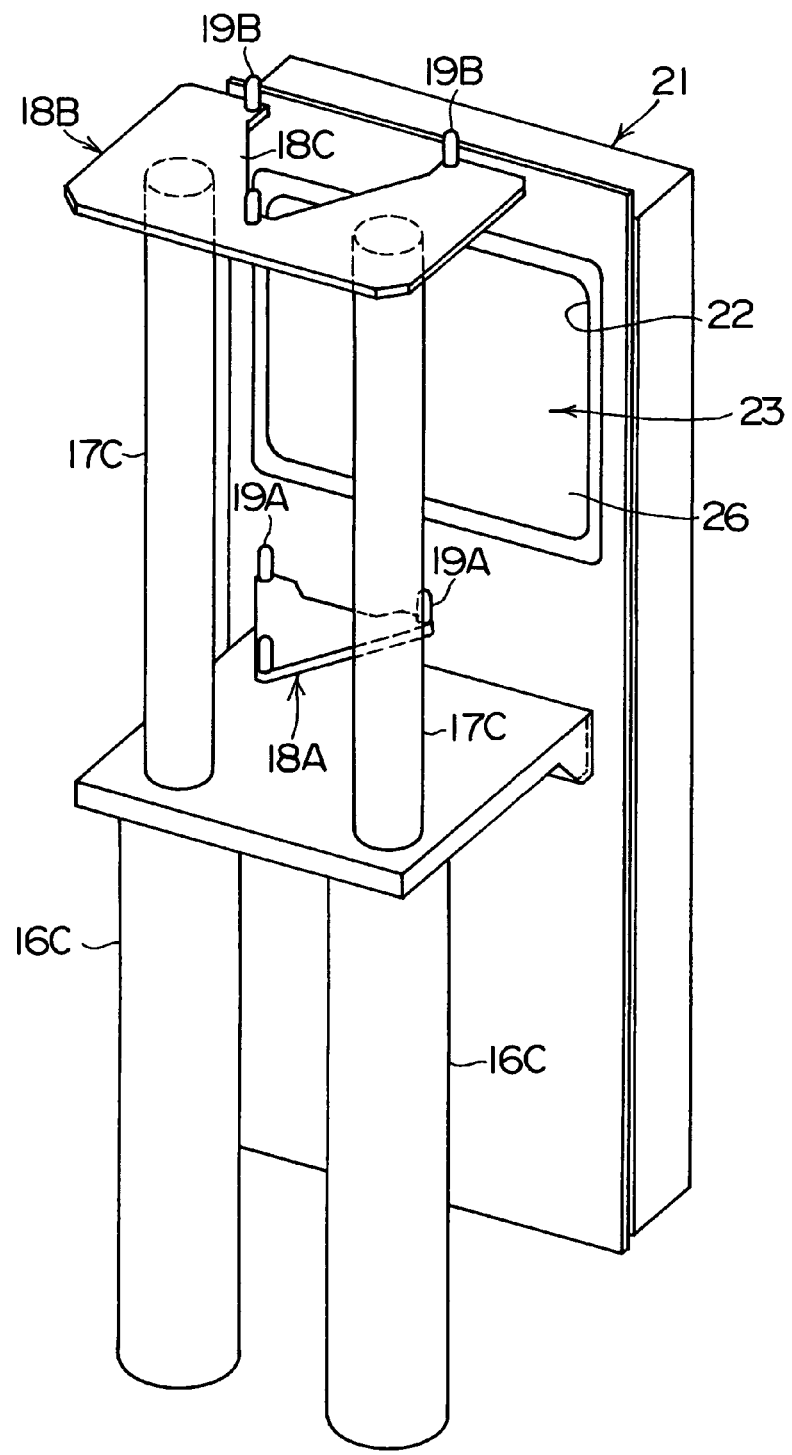
FIG. 13 is a perspective view showing the state where the outer plate is raised

FIG. 12 and FIG. 13 are each perspective views showing the load port of the batch CVD apparatus of the fourth embodiment of the present invention.

In the previously described third embodiment, however, the support stand 18 must rise and lower along with the linear actuator 95 so that the pod elevator 15B might have to be made a large and complex structure.

In order to resolve this potential problem, the support stand 18 of this embodiment is divided into an inner plate 18A and an outer plate 18B. The inner plate 18A makes up the first placement member (first placement unit) for moving away from and near the pod opener 23 (Lid attaching and detaching means, also simply called "the attaching and detaching device"). The outer plate 18B functions as the second placement member (second placement unit) for rising and lowering relative to the pod opener 23.

Figure 14A:
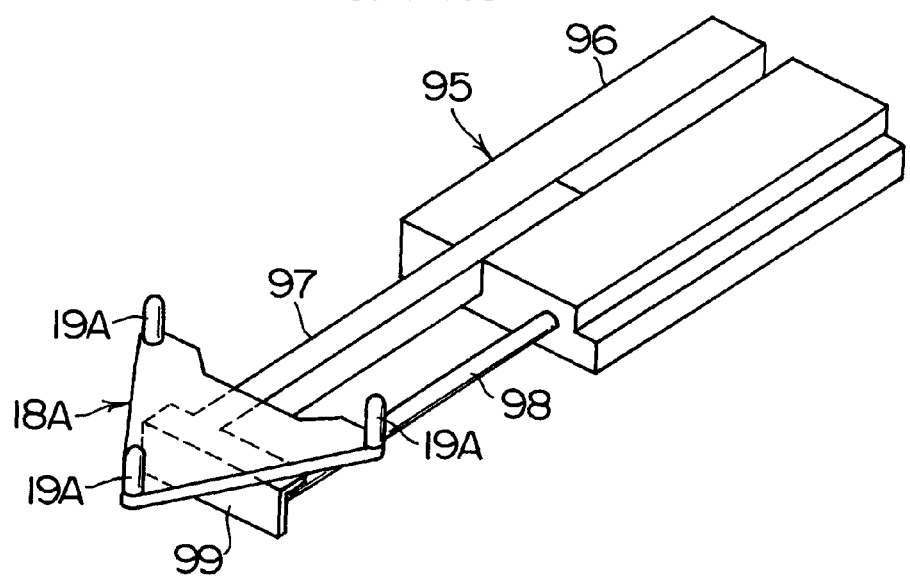
FIG. 14A and FIG. 14B are each perspective views of the linear actuator.
Figure 14B:
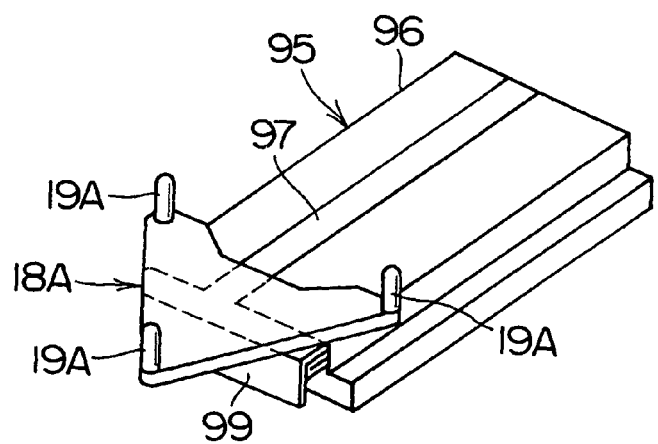

As shown in FIG. 14A and FIG. 14B, the inner plate 18A is formed as a roughly equilateral triangular flat plate as seen from a plan view. The linear actuator 95 moves the inner plate 18A in a horizontal and in a front-rear direction (also called "the far-near direction relative to the door loading and unloading opening 22"). The inner kinematic pins 19A are installed at three corner locations on the upper surface of the inner plate 18A, and installed respectively perpendicular to the upper surface of the inner plate 18A. The inner kinematic pins 19A are the positioning unit and are equivalent to the secondary pins defined in SEMI E57-0600.

A main piece 96 of the linear actuator 95 is installed at a position below and forward of the door loading and unloading opening 22 of the sealed case 21. The main piece 96 extends horizontally and also forward and rearward (also called "the far-near direction relative to the door loading and unloading opening 22"). The inner plate 18A is installed on the linear actuator 95 horizontally by way of a guide 97, a drive rod 98 and a bracket 99. The guide 97 and the drive rod 98 extend and contract relative to the main piece 96, to make the inner plate 18A move horizontally and also forward and rearward.

The inner plate 18A in other words has only to move away from and near the pod opener.

The outer plate 18B is formed in a rectangular flat plate shape as seen from a plan view as shown in FIG. 12 and FIG. 13. The outer plate 18B contains an escape portion (also called "a notch") 18C in the center on the long side facing the pod opener 23. The escape portion 18C is formed as an approximately equilateral triangle somewhat larger than the inner plate 18A.

The receiver kinematic pins 19B are installed at three corner locations at the escape portion 18c on the upper surface of the outer plate 18B and installed respectively perpendicular to the upper surface of the outer plate 18B. The receiver kinematic pin 19B of the outer plate 18B as shown in FIG. 12 is set to a position on the outer side of the inner kinematic pin 19A of the inner plate 18A.

The inner kinematic pin 19A and the receiver kinematic pin 19B are installed adjacently assuming that the inner plate 18A is in other words set to a state where inserted into the escape portion 18C of the outer plate 18B.

This inner kinematic pin 19A is the positioning unit and is equivalent to the primary pin defined in SEMI E57-0600.

A pair of elevator drive devices 16C, 16C is arrayed on the left and right in front of the sealed case 21 and each is installed perpendicularly facing upward. The outer plate 18B is installed horizontally on the upper ends of the shafts 17C, 17C of the elevator drive devices 16C, 16C. The elevator drive devices 16C, 16C make the outer plate 18B rise and lower by synchronizing with and respectively extending and contracting the shafts 17C, 17C.

These elevator drive devices need not be a pair and may for example be one unit or more than three units. The elevator drive devices are preferably installed as a pair to enclose the notch of the outer plate 18B from both sides to allow stable rising and lowering and to keep the costs low.

The pod handling step performed via the inner plate 18A and the outer plate 18B in the above structure are described next while referring to FIG. 15A through 15D and FIGS. 16A, 16B, 16C, 16D, 16F and 16G.

Other steps such as the mapping step as the process for mapping the wafers in the pods are the same as in the first embodiment so a description of these steps is omitted.

The linear actuator 95 is conveniently omitted from the drawings in FIG. 12, FIG. 13, FIG. 15A through 15D and FIGS. 16A, 16B, 16C, 16D, 16F and 16G.

The pod 2 transferred by an in-process transfer device such as an AGV 9, is placed on the inner plate 18A as shown in FIG. 15A.

The pod 2 is positioned at this time in the inner plate 18A by inserting the three inner kinematic pins 19A of the inner plate 18A into the inner positions of the three positioning holes 5 formed on the lower surface of the pod 2.

Next as shown in FIG. 14B, the linear actuator 95 contracts to make the pod 2 move towards the pod opener 23 and the door 4 support in the closure 26 of the pod opener 23 as shown in FIG. 15B.

The inert gas supply device 132 at this time supplies inert gas into the load lock chamber 20 to form an inert gas atmosphere.

Next, as shown in FIG. 15C, the closure 26 detaches the door 4 from the wafer loading and unloading opening 3.

As then shown in FIG. 15D, the closure 26 lowers within the load lock chamber 20 to make the door 4 separate from the wafer loading and unloading opening 3 position.

The mapping step and replacement of the atmosphere within the pod 2 with inert gas are performed according to the previously described action.

When the mapping is complete, the closure 26 attaches the door 4 onto the wafer loading and unloading opening 3.

Then as shown in FIG. 14A, the linear actuator 95 extends to make the inner plate 18A holding the pod 2, return back to the original position as shown in FIG. 16A.

In this state, the inner plate 18A is positioned directly above the escape portion 18C (See FIG. 12) of the outer plate 18B.

When a mismatch is found between the mapping information read in the mapping step, and the pre-supplied mapping information relating to the pod 2, an in-process transfer device such as an AGV 9 promptly returns the pod 2 where the mismatch was discovered, from the load port 14 to the previous process or to the wafer array process.

When the mapping information read in the mapping step matches the pre-supplied mapping information relating to the applicable pod 2, then the pair of elevator drive devices 16C, 16C makes the shafts 17C, 17C extend slightly.

The three receiver kinematic pins 19B of the outer plate 18B are in this way respectively inserted into the three positioning holes 5 of the pod 2 on the outer side of the three inner kinematic pins 19A of the inner plate 18A as shown in FIG. 16B. In other words, the outer plate 18B has received the pod 2 from the inner plate 18A.

The elevator drive devices 16C make the shaft 17C extend, and raise the pod 2 from the load port 14 to the height of the pod loading opening 12.

The receiver kinematic pin 19B is positioned on the outer side and so the outer plate 18B can stably raise the pod 2. Moreover, the outer plate 18B supports the bottom circumference of the pod so that the pod can be raised in a stable state.

The front shutter 13 opens the pod loading opening 12 when the pod 2 is raised to the height of the pod loading opening 12.

The arm 35c of the pod transfer mechanism 35b extends as shown in FIG. 7, to make the plate 35d supported by the tip of the arm 35c pass through the pod loading opening 12, and advance directly under the escape portion 18C of the outer plate 18B.

Next, the pod transfer elevator 35a rises to make the plate 35d pass through the escape portion 18C, and scoop up the pod 2 from the outer plate 18B. The three plate kinematic pins 35e of the plate 35d are at this time respectively inserted into the inner positions of the receiver kinematic pins 19B of the three positioning holes 5.

The pod 2 scooped up by the pod transfer mechanism 35b as described above is carried into the main case 11 from the pod loading opening 12 by the contraction of the arm 35c of the pod transfer mechanism 35b as shown in FIG. 16D.

The remaining steps are implemented the same as in the previously described first embodiment.

Incidentally, if the pod 2 is supplied from the swivel pod rack 31 to the load port 14, then as shown in FIG. 16F, the pod 2 is transferred by the pod transfer mechanism 35b from the swivel pod rack 31 to the raised outer plate 18B.

Next as shown in FIG. 16G, the outer plate 18B lowers to deliver the pod 2 to the inner plate 18A.

The abovementioned operations are then implemented.

The present embodiment renders one or more of the following effects in addition to one or more of the effects of the first through the third embodiments.

1) The structure of the pod elevator can be simplified since the structure is separated into the inner plate 18A for moving away from and near the pod opener; and the outer plate 18B for rising and lowering parallel to the opening surface of the door loading and unloading opening 22 in the pod opener.

2) The second placement unit and far-near moving mechanism need not be raised or lowered together during the raising and lowering of the first placement unit. On the other hand, the first placement unit and the elevator moving mechanism do not have to be moved together during far-near movement of the first placement unit. The structure of the elevator moving mechanism does not have to be enlarged and can be simplified, moreover the structure of the far-near moving mechanism does not have to be enlarged and can be simplified.

3) Receiver kinematic pins (primary pins) are installed in the first placement unit capable of up and down movement, and a notch is formed on the inner side in the first placement unit enclosed by the receiver kinematic pins. Moreover, the second placement unit whose at least portion can be inserted into this notch is installed. The second placement unit is capable of moving away from and near the pod opener.

The pod can in this way be smoothly delivered between the first placement unit and the second placement unit.

In this case for example, the case when delivering the pod between the second placement unit including a secondary pin rather than the first placement unit and the plate containing a primary pin of the transfer device; the plate of the transfer device must scoop up the pod while avoiding the second placement unit and member supporting the second placement unit, so that extreme measures must be contrived, causing the structure of the device to become complicated and the production cost to rise.

Figure 18:
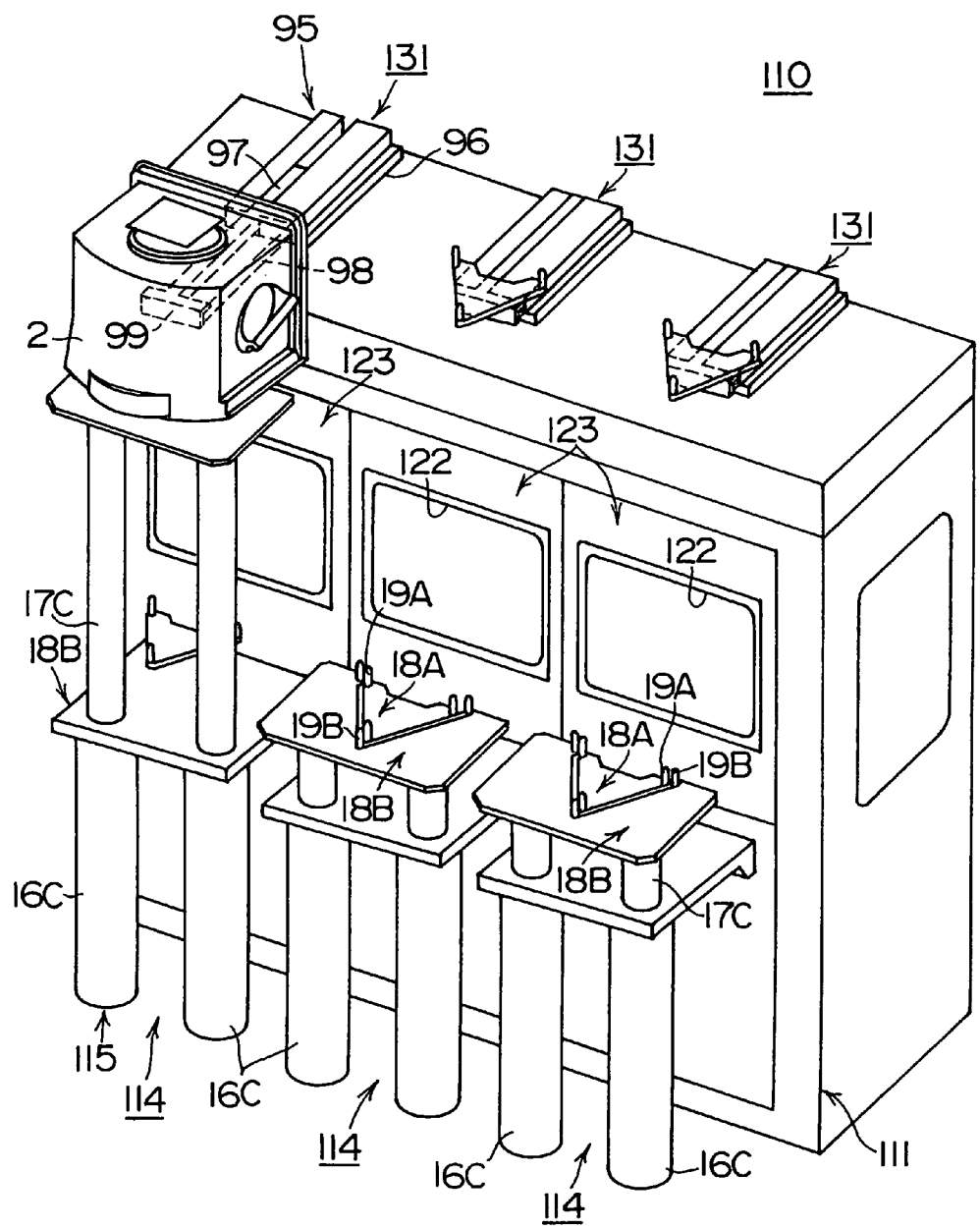
FIG. 18 is a perspective view showing the storage step while raised.
Figure 19:
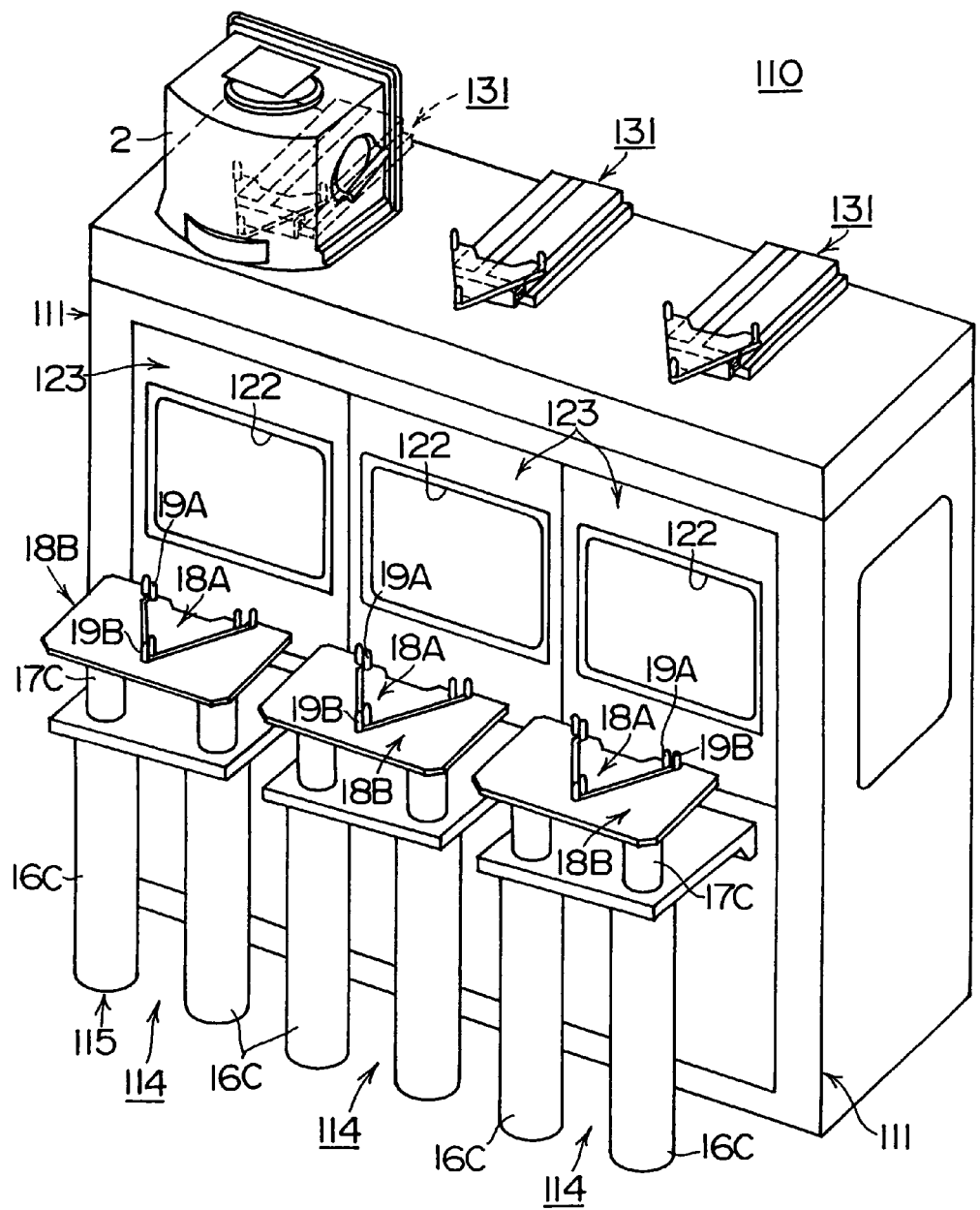
FIG. 19 is a perspective view showing the storage step while storing.

FIG. 17 through FIG. 19 show the fifth embodiment of the present invention in a single-wafer CVD apparatus with a load port including an inner plate and an outer plate.

Load ports 114 are arrayed from left to right at three locations on the front side of a main case 111 of a single-wafer CVD apparatus 110. Pod openers 123 are installed respectively on the front walls facing each of the load ports 114. Each of pod elevators 115 is installed in front of each of the pod openers 123.

Each of the pod elevators 115 contain a pair of elevator drive devices 16C, 16C. The pair of elevator drive devices 16C, 16C is arrayed on the left and right in each load port 114 and each is installed perpendicularly facing upward. The pair of elevator drive devices 16C, 16C affix the outer plate 18B horizontally, on the upper ends of the shafts 17C, 17C. The outer plate 18B is formed in an approximately rectangular shape containing an escape portion 18C. Both of the elevator drive devices 16C, 16C make the outer plate 18B rise and lower by synchronizing with and extending and contracting the shafts 17C, 17C.

The receiver kinematic pins 19B are each installed perpendicular to the upper surface of the outer plate 18B, at three corner locations at the escape portion 18C on the upper surface of the outer plate 18B.

Though omitted from the drawings in FIG. 17 through FIG. 19, each of the pod elevators 115 respectively contains a linear actuator 95. The main piece 96 of the linear actuator 95 is installed at a position directly below a door loading and unloading opening 122 of the pod opener 123. The main piece 96 extends horizontally and also forward and rearward.

The inner plate 18A is installed horizontally on the linear actuator 95 by way of the bracket 99 on the guide 97 and the drive rod 98. The guide 97 and the drive rod 98 extend and contract relative to the main piece 96 to move the inner plate 18A horizontally and also back and forth.

The inner plate 18A is formed as a roughly equilateral triangular flat plate as seen from a plan view. The linear actuator 95 moves the inner plate 18A in a horizontal and in a front-rear direction. The inner kinematic pins 19A are respectively installed perpendicularly at three corner locations on the upper surface of the inner plate 18A.

Three slide type pod racks 131 are arrayed from left to right on the upper surface of the main case 111. Each of the slide type pod racks 131 contains a linear actuator 95 to move the inner plate 18A horizontally and also forward and rearward.

The step for storing the pod 2 into the slide type pod racks 131 which is the step characteristic of this embodiment is described next while referring to FIG. 17, FIG. 18 and FIG. 19.

Assuming that the pod 2 shown in FIG. 17 is stored in the slide type pod rack 131, the three receiver kinematic pins 19B of the outer plate 18B are respectively inserted into the outer positions of the three positioning holes 5 formed on the lower surface of the pod 2.

The elevator drive device 16C extends the shaft 17C as shown in FIG. 18 to make the pod 2 held on the outer plate 18B rise to the height of the slide type pod rack 131.

Then as shown in FIG. 18, the linear actuator 95 of the slide type pod rack 131 extends to make the inner plate 18A move to directly under the escape portion 18C of the outer plate 18B.

Next, the elevator drive device 16C lowers the shaft 17C slightly. The three inner kinematic pins 19A of the inner plate 18A respectively insert into the three positioning holes 5 of the pod 2, on the inner side of the three receiver kinematic pins 19B of the outer plate 18B. In other words, the outer plate 18B has delivered the pod 2 to the inner plate 18A.

The linear actuator 95 of the slide type pod rack 131 next contracts to make the inner plate 18A pull back from the directly above the escape portion 18C of the outer plate 18B, and store the pod 2 in the slide type pod rack 131 as shown in FIG. 19.

When the pod 2 is supplied from the slide type pod rack 131 to the load port 114, the pod 2 is returned from the slide type pod rack 131 to the load port 114 in the reverse procedure to the previously described procedure.

The storage rack for automatically storing the pods in the above embodiment can be added to single wafer CVD apparatus.

The present invention is not limited by the above embodiments and needless to say, a multitude of diverse changes and adaptations not departing from the spirit and scope of the invention are possible.

The pod elevator for example is not limited to the installation of a pair of elevator drive devices and one elevator drive device may be installed. Preferably a guide is used if using only one elevator drive device. The three point support method for holding the pod is stable but two guides may also be used.

The drive device is not limited to a structure containing an air cylinder device and may be a combination of motor and ball-screw and guide, etc.

The optimal embodiment was described as an approximately equilateral triangle inner plate, and an approximately equilateral triangle escape portion formed slightly larger than the inner plate.

Forming an approximately equilateral triangle shape in this way allows stable support for the pod on the inner plate and on the outer plate.

However, the embodiment formed as shown in FIG. 20A through FIG. 20C is also suitable.

Namely, the pod can be delivered without interference between the inner plate and the outer plate.

In the example in FIG. 20A, the inner plate is formed in a square shape, and the notch of the outer plate is formed in a square shape.

In the example in FIG. 20B, the inner plate is formed in a horse hoof shape, and the notch of the outer plate is formed in a horse hoof shape.

In the example in FIG. 20C, the inner plate is formed in a triangular shape, and the notch of the outer plate is formed in a square shape.

Making the plate 35d of the pod transfer device match the shape of the inner plate at this time makes give and receive the pod easy.

The above embodiments were described as applied to a CVD apparatus, however, the present invention is not limited to a CVD apparatus and may apply to all types of substrate processing apparatus such as diffusion apparatus and annealing apparatus and oxidizing apparatus.

The substrate is not limited to wafers and may include photo mask or printed wiring boards, liquid crystal panels, compact disks and magnetic disks, etc.

Figure 21:
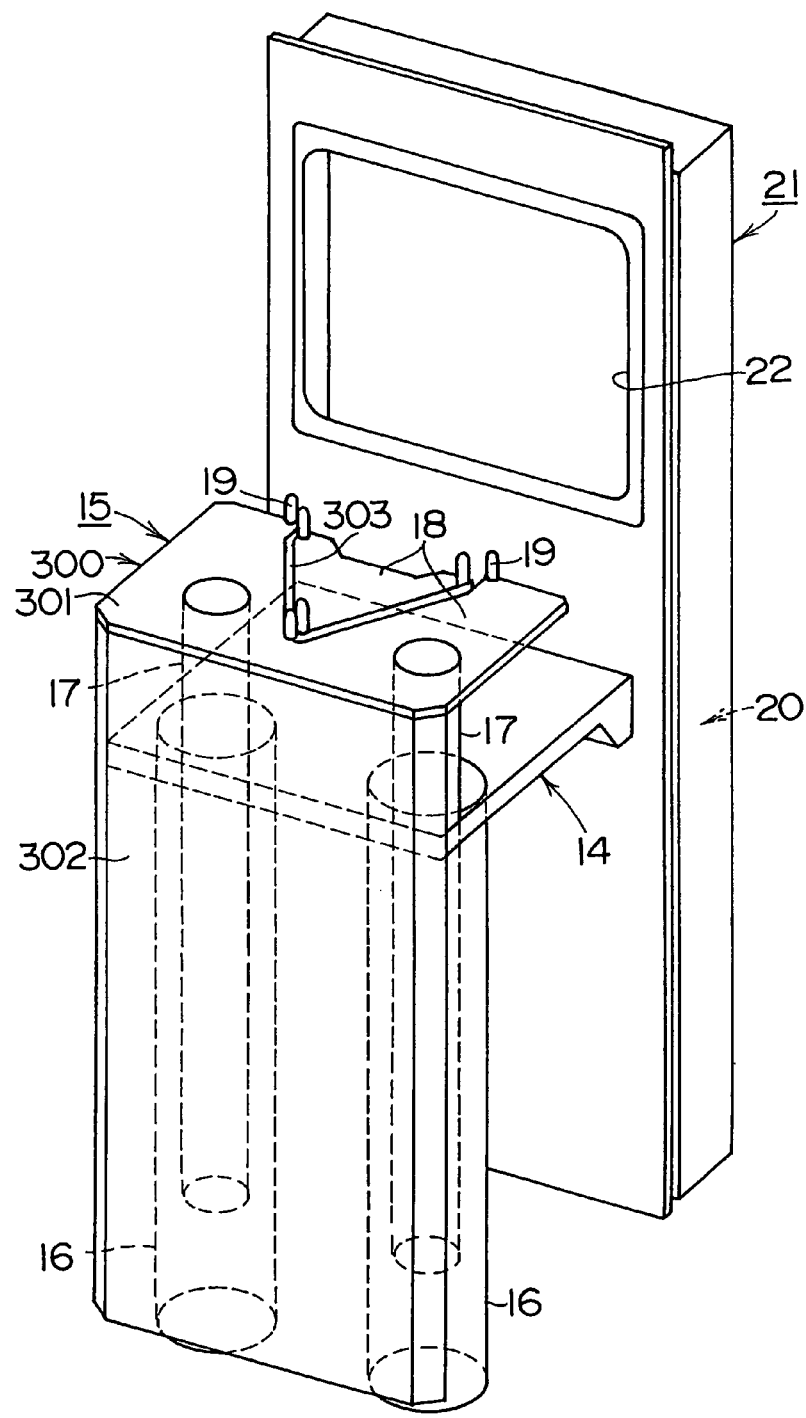
FIG. 21 is a perspective view showing a preferred embodiment of the pod elevator.

FIG. 21 is a perspective view showing a preferred embodiment of the pod elevator.

Figure 22:
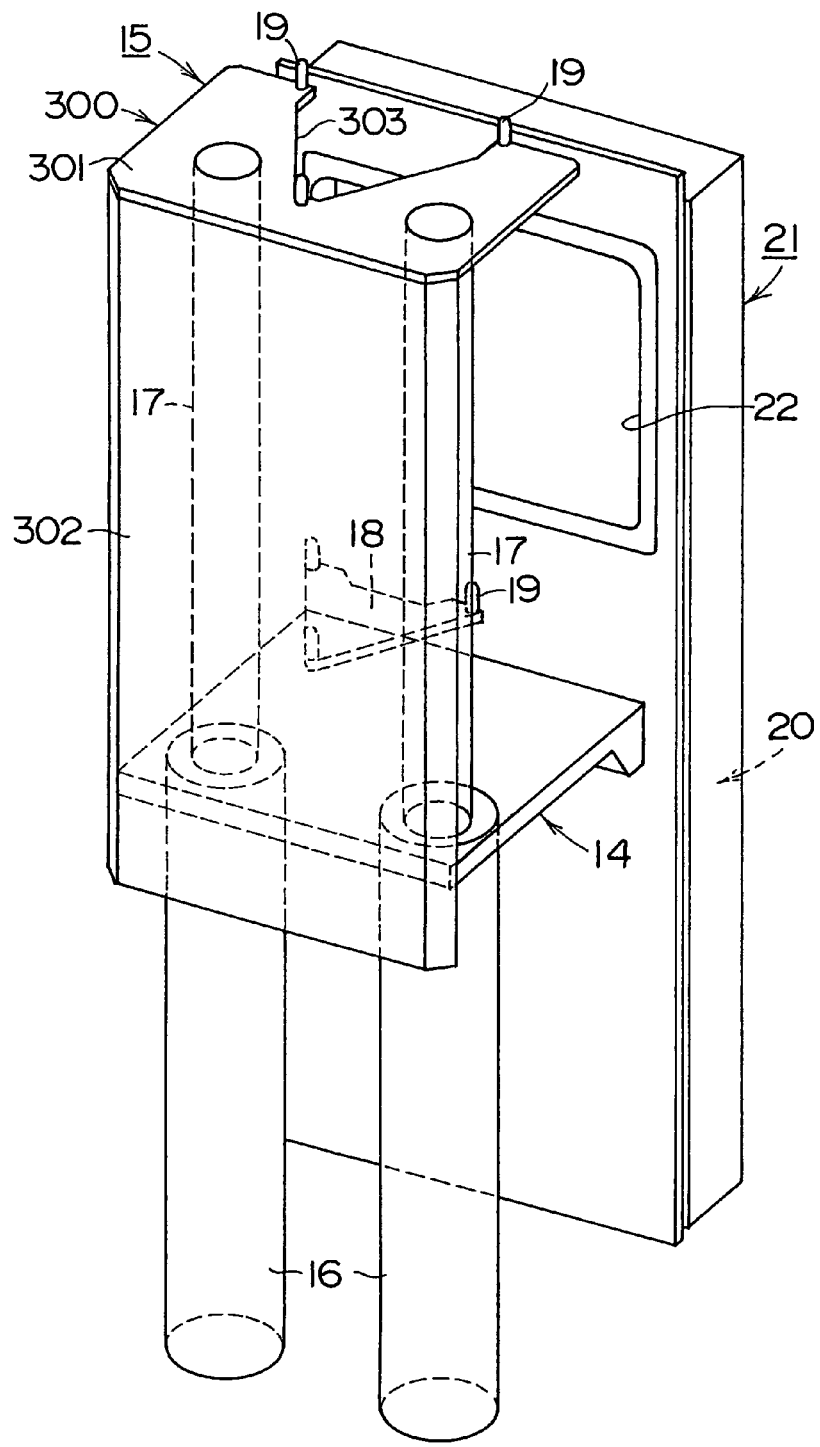
FIG. 22 is a perspective view showing the functional state of that pod elevator.

FIG. 22 is a perspective view showing the functional state of that pod elevator.

A cover 300 is attached to the pod elevator 15 as shown in FIG. 21. The cover 300 includes a horizontally placed ceiling plate 301, and a front plate 302 whose perpendicular top edge is clamped to the front edge of the ceiling plate 301. The ceiling plate 301 is clamped to the shaft 17 of the elevator drive device 16. The front plate 302 has a lateral width capable of covering the load port 14, and a height (See FIG. 22) taller than the stroke of the shaft 17.

One elevator drive device 16 and one shaft 17 are sufficient, preferably, however, two or more are installed at a specified spacing. The ceiling plate 301 can in this way stably rise and lower while the pod is mounted.

A triangular escape hole 303 is formed in the ceiling plate 301 in a section opposite the support stand 18 in the load port 14. The kinematic pins 19 are affixed at the respective triangular peaks of the escape hole 303. The ceiling plate 301 therefore also makes up a pod placement unit as well as a support unit for holding the bottom surface of the pod 2.

The ceiling plate 301 may be expressed as the support unit, and the cover 300 may be expressed as the unit clamped to the support section.

The cover 300 may not always be clamped to the support unit. A drive device for example may be installed on the cover 300, and the cover 300 may be raised up and down by the operation of the support unit and elevator mechanism.

The function and effect of the above pod elevator are described next.

Though the pod 2 is not shown in the drawing conveniently, the ceiling plate 301 scoops up the pod 2 from the support stand 18 when shifting from the state in FIG. 21 to the state in FIG. 22. The kinematic pins 19 of the ceiling plate 301 at this time fit respectively into the positioning holes 5 on the lower surface of the pod 2, on the outer side of the kinematic pin 19 of the support stand 18.

During normal standby operation, the ceiling plate 301 is positioned below the support stand 18, and avoids interference when the support stand 18 moves forward or rearwards relative to the door loading and unloading opening 22.

The ceiling plate 301 delivers the pod 2 onto the support stand 18 during the transition from the state in FIG. 22 to the state in FIG. 21.

The cover 300 covering the pod elevator 15 prevents particles from flying out from the pod elevator 15. Particles are particularly prone to fly outwards from the equipment since the elevator drive device 16 and the shaft 17 are exposed by the front opening 14C from the front of the equipment while in a state where the ceiling plate 301 has raised the pod 2 to the vicinity of the pod loading opening 12. However, the cover 300 can prevent these types of particles from flying outwards.

The cover 300 covering the pod elevator 15 also can prevent hazards to the operator due to exposure of the elevator drive device 16 and the shaft 17 in the work space.

The cover 300 for example can prevent the operator from coming in contact with the elevator drive device 16 and the shaft 17 while the operator is working to transfer the pod 2 by hand from the front opening 14C of the box 14A (See FIG. 1) to the load port 14.

Figure 23:
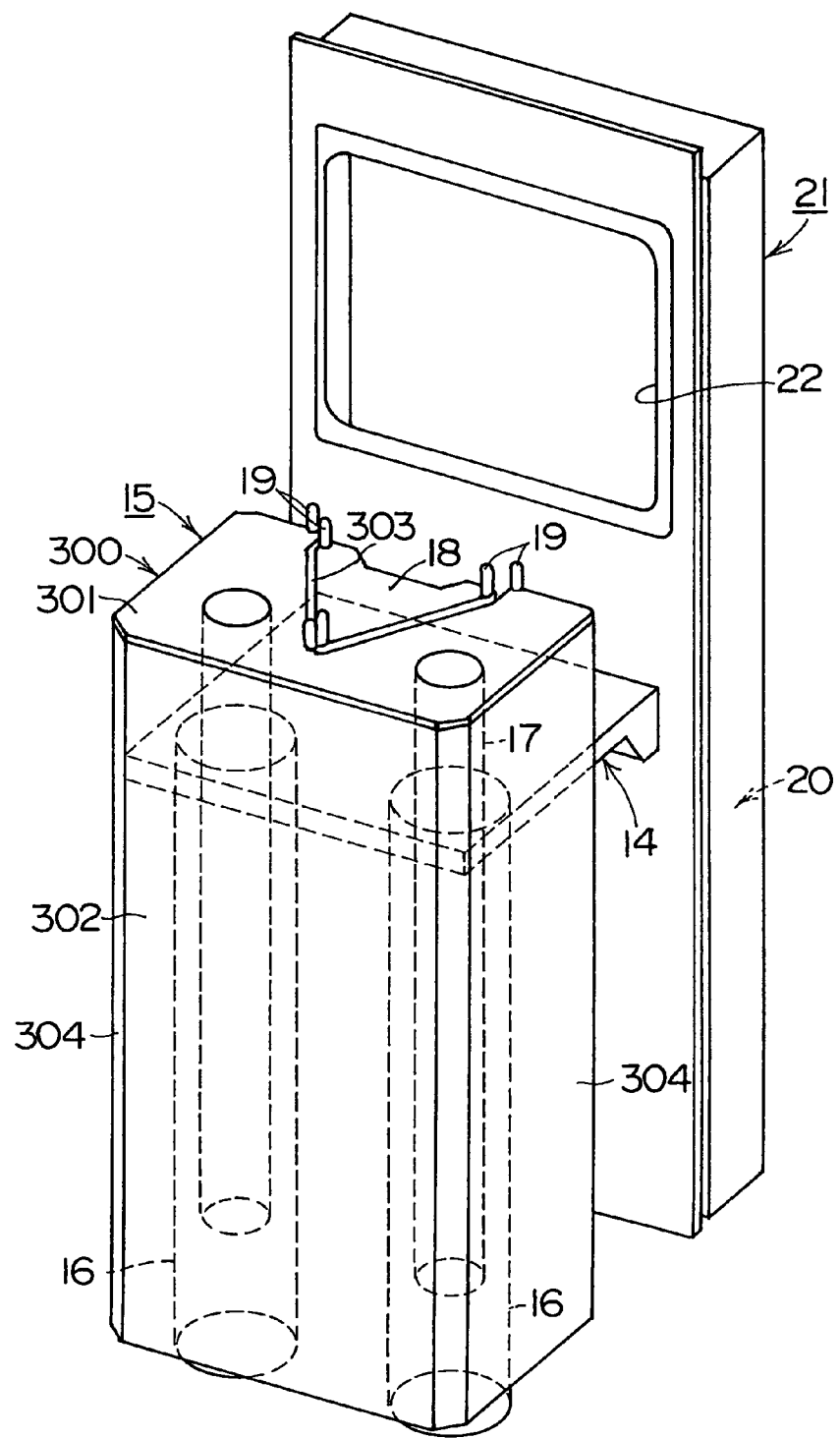
FIG. 23 is a perspective view showing a preferred embodiment of the pod elevator.

FIG. 23 is a perspective view showing a further preferred embodiment of the pod elevator.

Figure 24:
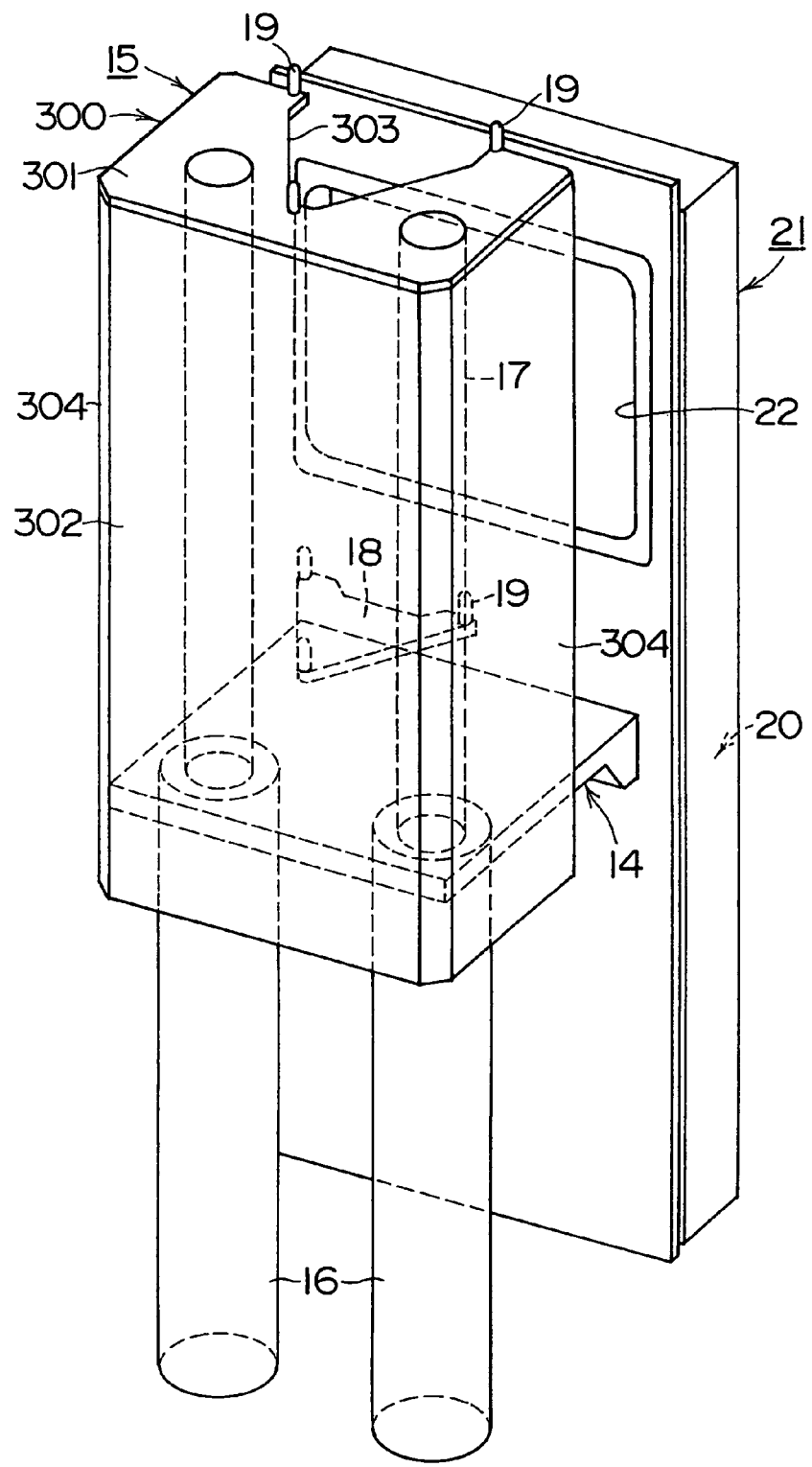
FIG. 24 is a perspective view showing the functional state of that pod elevator.

FIG. 24 is a perspective view showing the functional state of that pod elevator.

The point where the present embodiment differs from the previous embodiments is that the cover 300 contains a pair of side plates 304, 304. This pair of side plates 304, 304 are clamped at right angles on both the left and right edges of the front plate 302. The pair of side plates 304, 304 are in other words installed on three side surfaces other than the side where the pod opener 23 is installed.

In the present embodiment, the cover 300 covers the left and right sides as well as forward of the pod elevator 15 so that the effect of preventing particles from flying outward and the effect of maintaining safety are even further enhanced.

The embodiments where a pod elevator is installed as shown in FIG. 21 through FIG. 24, are also applicable to the first embodiment through the fifth embodiment. If applied to these embodiments then the same effects can be obtained.

The present invention is not limited by the above embodiments and needless to say, a multitude of diverse changes and adaptations not departing from the spirit and scope of the invention are possible.

The front shutter 13 for example is preferably installed or the pod loading opening 12 is preferably formed with a small-sized opening in view of the need to prevent particles from flying out from the equipment or maintain the sealing of the pod storage chamber. However, the front shutter 13 may be eliminated.

The pod loading opening 12 may be formed to a maximum size, and almost the whole compartment wall above the sealed case 21 and the pod opener 23 may substantially be formed as an opening.

The pod elevator 15 for example may pre-raise the support stand 18 (ceiling plate 301) to a position accessible by the pod transfer device 35, the pod received from the OHT at that position, and the pod received by the pod transfer device 35 from the support stand 18 without lowering the support stand 18 and opening and closing the door 4.

Performing the operation in this way, allows shortening the range the OHT lowers, by the amount that the support stand 18 rises. There is also no need to raise the pod transfer device 35 to a height allowing access after the support stand 18 receives the pod from the OHT so that the transfer time can be shortened.

The pod transfer device 35 for example can be made the grip type rather than the scoop type by utilizing a structure where the pod elevator 15 raises the pod mounted on the outer plate so that at least a portion of the pod is higher than the upper edge of the load lock chamber. In this case, however, the grip method has the disadvantage that the transfer is unstable and more transfer space is needed compared to the scoop method.

The first placement unit and the second placement unit for example need not be a plate shape, and may be formed with a curved bottom surface and a flat surface only on the upper side, etc.

The mapping device of the first embodiment may also be applied to the second embodiment, third embodiment, and fourth embodiment. The mapping device of the second embodiment, third embodiment, and fourth embodiment may also be applied to the first embodiment.

The preferred aspects are described next.

(1) A substrate processing apparatus comprising:
a storage container for storing multiple substrates and whose substrate loading and unloading opening is sealed by a lid,
a load port for placing the storage container,
an attaching and detaching device for attaching and detaching the lid on the substrate loading and unloading opening in the load port,
a first placement unit for mounting the storage container in the load port and moving away from and near the attaching and detaching device, and
a second placement unit provided separately from the first placement unit, for mounting the storage container in the load port and moving up and down relative to the attaching and detaching device.

(2) A manufacturing method for a semiconductor device comprising the steps of:
carrying a storage container storing multiple substrates with a substrate loading and unloading opening sealed by a lid into a load port, operating a first placement unit at the load port and moving the storage container mounted in the first placement unit near an attaching and detaching device, detaching the lid from the substrate loading and unloading opening of the storage container mounted in the first placement unit with the attaching and detaching device, attaching the lid on the substrate loading and unloading opening of the storage container mounted in the first placement unit with the attaching and detaching device, operating the first placement unit, and moving the storage container mounted in the first placement unit away from the attaching and detaching device, raising a second placement unit, and delivering the storage container from the first placement unit to the second placement unit, carrying the substrates stored in the storage container into a processing chamber, and processing the substrates in the processing chamber.

(3) A substrate processing apparatus according to the first aspect (1), wherein the second placement unit supports a bottom portion closer to the bottom circumferential side of the storage container than the first placement unit.

(4) A substrate processing apparatus according to the third aspect (3), wherein the first placement unit supports a bottom portion closer to the bottom center side of the storage container than the second placement unit.

(5) A substrate processing apparatus according to the third aspect (3), wherein a notch is formed on the center section on the attaching and detaching device side of the second placement unit, and the first placement unit can be positioned in the notch.

(6) A substrate processing apparatus according to the third aspect (3) or the fourth aspect (4), wherein the first placement unit and the second placement unit are capable of simultaneously supporting the one storage container in the load port.

(7) A substrate processing apparatus according to the first aspect (1), comprising a storage rack capable of storing the multiple storage containers, and a transfer device capable of transferring the storage container between the second placement unit and the storage rack, wherein the transfer device contains a support unit for supporting a bottom portion closer to the bottom center side of the storage container than the second placement unit.

(8) A substrate processing apparatus according to the first aspect (1), further comprising a storage chamber provided adjacent to the load port for storing the storage container, and a transfer device installed in the storage chamber and capable of transferring the storage container between the storage chamber and the second placement unit.

(9) A substrate processing apparatus according to the eighth aspect (8), wherein the transfer device contains a support unit for supporting a bottom portion closer to the bottom center side of the storage container than the second placement unit.

(10) A substrate processing apparatus according to the first aspect (1), comprising an elevator device for raising and lowering the second placement unit, and a moving device for moving the first placement unit away from and near the attaching and detaching device.

(11) A substrate processing apparatus according to the first aspect (1), wherein positioning units for positioning the multiple storage containers are installed respectively in the first placement unit and the second placement unit; and the positioning units for the first placement unit and the second placement unit are installed adjacent to each other.

(12) A substrate processing apparatus according to the first aspect (1), comprising an opening and closing chamber for enclosing the attaching and detaching device and being capable of filling inert gas.

(13) A substrate processing apparatus according to the twelfth aspect (12), wherein an elevator device for raising at least a portion of the storage container placed in the second placement unit to a position higher than the upper edge of the opening and closing chamber, is installed in the second placement unit.

(14) A substrate processing apparatus according to the seventh aspect (7), wherein a processing chamber for processing the substrates is provided, the load port and the storage chamber and the processing chamber are sequentially arranged, and further a transfer device capable of accessing the bottom of the storage container placed in the second placement unit in the load port is installed in the storage chamber.

(15) A substrate processing apparatus according to the seventh aspect (7), wherein an elevator mechanism capable of moving from a position at a height for giving and receiving the storage container between the outside and the inside of the storage chamber, to a position at a height for the attaching and detaching device to open and close the substrate loading and unloading opening of the storage container, is installed in the second placement unit.

(16) A substrate processing apparatus according to the tenth aspect (10), wherein a detector capable of detecting the status of the substrates within the storage container is installed in the opening and closing chamber.

(17) A substrate processing apparatus according to the thirteenth aspect (13), comprising a cover for covering the lower section of the second placement unit and being raised and lowered by the operation of the elevator mechanism.

(18) A transfer method for a storage container comprising the steps of:

carrying a storage container storing multiple substrates with a substrate loading and unloading opening sealed by a lid, into a load port containing an attaching and detaching device for attaching and detaching the lid, and raising a second placement unit in the load port, and delivering the storage container placed in a first placement unit moved away from the attaching and detaching device, from the first placement unit to the second placement unit.

(19) A substrate processing apparatus comprising:

a storage container for storing substrates and whose substrate loading and unloading opening is sealed by a lid, a load port for carrying the storage container in and out between the inside and the outside of the case, an attaching and detaching device for attaching and detaching the lid on the substrate loading and unloading opening, a placement unit for mounting the storage container in the load port and moving up and down relative to the attaching and detaching device, the placement unit being notched so as to form a space on the attaching and detaching device side which is a section of the storage container bottom when mounted with the storage container.

The invention claimed is:

1. A substrate processing apparatus, comprising:
a storage container for storing multiple substrates and whose substrate loading and unloading opening is sealed by a lid,
a load port for placing the storage container,
an attaching and detaching device for attaching and detaching the lid on the substrate loading and unloading opening in the load port, a first placement unit having a first placement member adapted to support a bottom center side of the storage container in the load port, and for moving the storage container supported on the first placement member away from and near the attaching and detaching device, a second placement unit comprising a second placement member and an elevator mechanism wherein the second placement member has a notch being capable of positioning the first placement member on an attaching and detaching device side in the load port, and supports a bottom outer side of the storage container further out than the bottom center side which supports the first placement member, and the elevator mechanism is installed vertically on a face of the second placement member for supporting the storage container, and moves the storage container supported on the second placement member up and down relative to the attaching and detaching device, a storage chamber provided adjacent to the load port on a side closer to the attaching and detaching device than the first placement unit and the second placement unit for storing the storage container, and a transfer device installed in the storage chamber, having a support member adapted to support the bottom center side of the storage container in the notch and for transferring the storage container between the storage chamber and the second placement member.

2. A substrate processing apparatus according to claim 1, comprising an opening and closing chamber for enclosing the attaching and detaching device and being capable of filling inert gas.

3. A substrate processing apparatus according to claim 2, wherein the elevator mechanism for raising at least a portion of the storage container placed in the second placement unit to a position higher than an upper edge of the opening and closing chamber, is installed in the second placement unit.

4. A substrate processing apparatus according to claim 3, comprising a cover for covering a lower section of the second placement unit and being raised and lowered by the operation of the elevator mechanism.

5. A substrate processing apparatus according to claim 1, wherein a storage rack is provided that is capable of storing multiple storage containers, and the transfer device is capable of transferring a storage container of the multiple storage containers between the second placement unit and the storage rack, and wherein the transfer device contains the support unit for supporting the inner bottom portion of the storage container positioned inside the outer bottom portion supported by the second placement unit.

6. A substrate processing apparatus according to claim 5, wherein a processing chamber for processing the substrates is provided, the load port and the storage chamber and the processing chamber are sequentially arranged, and further the transfer device capable of accessing the bottom of the storage container placed in the second placement unit in the load port is installed in the storage chamber.

7. A substrate processing apparatus according to claim 5, wherein the elevator mechanism capable of moving from a position at a height for giving and receiving the storage container between the outside and the inside of the storage chamber, to a position at a height for the attaching and detaching device to open and close the substrate loading and unloading opening of the storage container, is installed in the second placement unit.

8. A substrate processing apparatus according to claim 1, wherein the first placement unit and the second placement unit are capable of simultaneously supporting the one storage container in the load port.

9. A substrate processing apparatus according to claim 1, further comprising the elevator mechanism for raising and lowering the second placement unit installed on an upper end of the elevator device, and a moving device for moving the first placement unit away from and near the attaching and detaching device.

10. A substrate processing apparatus according to claim 1, wherein a storage rack is provided that is capable of storing multiple storage containers, and a plurality of placement units are provided, including first and second placement units, and positioning units for positioning multiple storage containers are installed respectively in the first placement unit and the second placement unit; and the positioning units for the first placement unit and the second placement unit are installed adjacent to each other.

11. A substrate processing apparatus according to claim 1, further comprising a case storing the attaching and detaching device, and a slide type storage container rack provided on an upper surface of the case for storing the storage container supported by the first placement member.

12. A substrate processing apparatus according to claim 1, wherein the elevator mechanism has two or more shafts whose upper ends are connected to the second placement member, and an elevator drive device for synchronizing with and respectively extending and contracting the shafts.

13. A substrate processing apparatus according to claim 1, wherein the elevator mechanism has a pair of shafts whose upper ends are connected to both sides of the notch of the second placement member, and an elevator drive device for synchronizing with and respectively extending and contracting the pair of shafts.

14. A load port for placing a storage container for storing multiple substrates and whose substrate loading and unloading opening is sealed by a lid comprising:

a first placement unit having a first placement member adapted to support a bottom center side of the storage container, and for moving the storage container supported on the first placement member away from and near an attaching and detaching device for attaching and detaching the lid on the substrate loading and unloading opening, a second placement unit comprising a second placement member and an elevator mechanism wherein the second placement member has a notch being capable of positioning the first placement member on the attaching and detaching device side, and supports a bottom outer side of the storage container further out than the bottom center side which supports the first placement member, and delivers the storage container to a transfer device for transferring the storage container to a storage chamber for storing the storage container, and the elevator mechanism is installed vertically on a face of the second placement member for supporting the storage container, and moves the storage container supported on the second placement member up and down relative to the attaching and detaching device.

15. A load port according to claim 14, wherein the elevator mechanism has two or more shafts whose upper ends are connected with the second placement member, and an elevator drive device for synchronizing with and respectively extending and contracting the shafts.

16. A load port according to claim 14, wherein the elevator mechanism has a pair of shafts whose upper ends are connected to both sides of the notch of the second placement member, and an elevator drive device for synchronizing with and respectively extending and contracting the pair shafts.

17. A load port according to claim 14, comprising a cover for covering the elevator mechanism by a lower section of the second placement member.

18. A manufacturing method for a semiconductor device, comprising:
- carrying a storage container storing multiple substrates with a substrate loading and unloading opening sealed by a lid into a load port,
- operating a first placement unit, having an inner plate, at the load port and moving the storage container supported on a bottom center side by a first placement member of the first placement unit near an attaching and detaching device,
- detaching the lid from the substrate loading and unloading opening of the storage container supported on the bottom center side by the first placement member with the attaching and detaching device,
- attaching the lid on the substrate loading and unloading opening of the storage container supported on the bottom center side by the first placement member with the attaching and detaching device,
- operating the first placement unit, and moving the storage container supported on the bottom center side by the first placement member away from the attaching and detaching device, and positioning the first placement member on a notch formed on the attaching and detaching device side of a second placement member of a second placement unit,
- raising the second placement member by operating an elevator mechanism installed vertically on a face of the second placement member for supporting the storage container, and delivering the storage container from the first placement unit to the second placement member for supporting a bottom outer side of the storage container further out than the bottom center side which supports the first placement unit, and
- transferring the storage container delivered on the second placement member by a transfer device between the second placement member and a storage chamber provided adjacent to the load port on a side closer to the attaching and detaching device than the first placement unit and the second placement unit for storing the storage container.

19. A transfer method for a storage container, comprising:
- carrying the storage container storing multiple substrates with a substrate loading and unloading opening sealed by a lid, into a load port containing an attaching and detaching device for attaching and detaching the lid, and
- operating a first placement unit at the load port and moving the storage container supported on a bottom center side by a first placement member of the first placement unit near the attaching and detaching device,
- detaching the lid from the substrate loading and unloading opening of the storage container supported on the bottom center side by the first placement member with the attaching and detaching device,
- attaching the lid on the substrate loading and unloading opening of the storage container supported on the bottom center side by the first placement member with the attaching and detaching device,
- operating the first placement unit, and moving the storage container supported on the bottom center side by the first placement member away from the attaching and detaching device, and positioning the first placement member on a notch formed on the attaching and detaching device side of a second placement member of a second placement unit,
- raising the second placement member by operating an elevator mechanism installed vertically on a face of the second placement member for supporting the storage container, and delivering the storage container from the first placement unit to the second placement member for supporting a bottom outer side of the storage container further out than the bottom center side which supports the first placement member, and
- transferring the storage container delivered on the second placement member by a transfer device between the second placement member and a storage chamber provided adjacent to the load port on a side closer to the attaching and detaching device than the first placement unit and the second placement unit for storing the storage container.

\* \* \* \* \*